United States Patent [19]
Kato et al.

[11] Patent Number: 5,962,902
[45] Date of Patent: Oct. 5, 1999

[54] SEMICONDUCTOR CMOS DEVICE WITH CIRCUIT FOR PREVENTING LATCH-UP

[75] Inventors: Katsuhiro Kato; Hidekazu Kikuchi, both of Tokyo, Japan

[73] Assignee: Oki Electric Industry Co., Ltd., Tokyo, Japan

[21] Appl. No.: 08/915,325

[22] Filed: Aug. 20, 1997

[30] Foreign Application Priority Data

Aug. 21, 1996 [JP] Japan ................................. 8-220079

[51] Int. Cl.$^6$ ..................................................... H02H 3/20
[52] U.S. Cl. ........................... 257/372; 257/173; 257/174; 257/328; 257/355; 257/356; 257/357; 257/358; 257/359; 257/360
[58] Field of Search ..................................... 257/355–360, 257/372, 328, 173, 174; 327/91, 94, 428

[56] References Cited

U.S. PATENT DOCUMENTS

| | | |
|---|---|---|
| 4,476,476 | 10/1984 | Yu et al. . |
| 4,647,956 | 3/1987 | Shrivastava et al. . |
| 4,686,602 | 8/1987 | Bucksch . |
| 4,870,530 | 9/1989 | Hurst et al. . |
| 5,468,984 | 11/1995 | Efland et al. ............................ 257/356 |
| 5,629,544 | 5/1997 | Voldman et al. ....................... 257/356 |

FOREIGN PATENT DOCUMENTS

| | | |
|---|---|---|
| 61-18315 | 1/1986 | Japan . |
| 2-119169 | 5/1990 | Japan . |
| 4-247654 | 9/1992 | Japan . |
| 4-324641 | 11/1992 | Japan . |

Primary Examiner—Tom Thomas
Assistant Examiner—Fetsum Abraham
Attorney, Agent, or Firm—Venable; Robert J. Frank; Michael A. Sartori

[57] ABSTRACT

A semiconductor device has a substrate bias generating circuit for generating a substrate bias to be applied to a p-type semiconductor substrate, a CMOS circuit formed on the semiconductor substrate, and a latch-up protection circuit. The latch-up protection circuit has an n-type first region, a highly doped n-type second region, a p-type third region apart from the second region, in the first region and an n-type fourth region surrounding said first region formed apart from the first region on the surface of the substrate. The second region is coupled with a power supply Vcc, the third region is coupled with an input line, the fourth region is coupled with a ground Vss, and the substrate is coupled with the substrate bias generating circuit.

13 Claims, 24 Drawing Sheets

SEMICONDUCTOR CMOS DEVICE WITH CIRCUIT FOR PREVENTING LATCH-UP

CROSS REFERENCE TO RELATED APPLICATION

This application claims the priority of Japanese Application Serial No. 220079/1996 filed Aug. 21, 1996 the subject matter of which is incorporated herein by reference.

BACKGROUND OF THE INVENTION

This invention relates to a semiconductor device having a latch-up protection circuit formed on a semiconductor substrate for preventing a latch-up.

Consider a semiconductor device having an internal Complementary Metal Oxide Semiconductor (CMOS) circuit and an electrostatic breakdown protection circuit formed in an input circuit through which an input signal is input to the CMOS circuit. When an excessive voltage such as electrostatic surge, etc. is input from an input line to the CMOS circuit through the electrostatic breakdown protection circuit, the excessive voltage sometimes triggers a latch-up. Therefore, a latch-up protection circuit is formed on the semiconductor substrate for preventing a latch-up from occurring in the CMOS circuit. The latch-up protection circuit typically has an impurity diffusion region which surrounds the electrostatic breakdown protection circuit on a surface of a semiconductor substrate (called surrounding diffusion region hereinafter). The surrounding diffusion region and the electrostatic breakdown protection circuit form a multicollector type of parasitic bipolar transistor. Hence, as shown in the following first comparative example, a part of the surge can be discharged as a collector current from the input line to the surrounding diffusion region. Consequently, the latch-up protection circuit, which reduces a ratio of the surge flowing into the CMOS circuit, prevents the latch-up from occurring in the CMOS circuit.

Now, in a semiconductor device having a CMOS circuit, for example, in a semiconductor memory device represented by a dynamic random access memory (DRAM), a substrate bias is applied to a semiconductor substrate of the semiconductor device in order to ensure optimum working of the CMOS circuit. The semiconductor device usually has a built-in substrate bias generating circuit for generating a substrate bias to be applied to the semiconductor substrate, because the substrate bias is indispensable for the device to function as a semiconductor device and because the built-in substrate bias generating circuit makes the semiconductor device easy to use. The substrate bias generated by the built-in substrate bias generating circuit is applied to the semiconductor substrate through a diffusion region for applying the substrate bias.

However, if the diffusion region and a surrounding diffusion region have the same conductive type and are coupled with each other, the following problems occur. The substrate bias generating circuit is generally supplied with a little current and has much internal impedance as a power source. So, the substrate bias be changed easily when surge flows from an input line into the substrate bias generating circuit through the surrounding diffusion region. Then, as shown in the following comparative case 2, latch-up in the CMOS circuit occurs more often. Consequently, it becomes more difficult to prevent latch-up from occurring if a latch-up protection circuit which works as a prior multicollector type of parasitic bipolar transistor is formed in the semiconductor device with the built-in substrate bias generating circuit. Namely, latch-up tolerance of the semiconductor device deteriorates.

A protection resistor may be formed between an input line and a CMOS circuit in order to delay the surge flow into the CMOS circuit, instead of forming an electrostatic breakdown protection circuit, so as not to form a multicollector type of parasitic bipolar transistor. If a protection resistor is used, protection resistor needs to have a large enough large resistance.

However, the larger the resistance of the protection resistor, the more transmission of an input signal is delayed. So, a protection resistor with large enough resistance can not be formed in a semiconductor device required to be used in high-speed operation. Consequently, for the conventional semiconductor device with the protection resistor, is difficult to obtain enough electrostatic breakdown tolerance.

Hence, for semiconductor device with a substrate bias generating circuit, it is desired not to reduce operation speed and desired to keep the latch-up tolerance and the electrostatic breakdown tolerance.

SUMMARY OF THE INVENTION

It is a primary object of this invention to provide a semiconductor device with a substrate bias generating circuit, which has sufficient latch-up tolerance and sufficient electrostatic breakdown tolerance without reducing operation speed.

It is another object of this invention to reduce an area occupied by a latch-up protection circuit in the semiconductor device.

It is a further object of this invention to reduce an area occupied by a latch-up protection circuit and an electrostatic breakdown protection circuit in the semiconductor device.

These and other objects are accomplished by a semiconductor device according to a first invention, including a substrate bias generating circuit for generating a substrate bias to be applied to a semiconductor substrate of a first conductive type, a CMOS circuit formed on the semiconductor substrate and a first protection circuit formed on the semiconductor substrate for preventing a latch-up from occurring in the CMOS circuit, the first protection circuit comprising, a first diffusion region of a second conductive type formed on the substrate, a second diffusion region of the second conductive type doped more heavily than the first diffusion region formed in the first diffusion region, a third diffusion region of the first conductive type formed apart from the second diffusion region in the first diffusion region, and a fourth diffusion region of the second conductive type surrounding said first diffusion region formed apart from the first diffusion region on the surface of the substrate, wherein the second diffusion region is electrically coupled with a first power supply, the third diffusion region is electrically coupled with an input line, the fourth diffusion region is electrically coupled with a second power supply having different potential from the first power supply, and the substrate is electrically coupled with the substrate bias generating circuit at the outside of the first protection circuit.

The first protection circuit preferably comprises a control gate electrode formed on said first diffusion region between said second diffusion region and said third diffusion region for controlling an MOS FET.

The first protection circuit preferably comprises an bipolar transistor and said fourth diffusion region is operable as a collector of said bipolar transistor.

The semiconductor device further comprises a second protection circuit for preventing electrostatic breakdown from occurring in the CMOS circuit, and said second protection circuit having a resistor including said third diffusion region as a part of the resistor.

The resistor preferably comprises a first electrode on said third diffusion region and electrically coupled with a control gate electrode in the CMOS circuit and a second electrode on said third diffusion region coupled with the input line, and a part of said third diffusion region between the first electrode and the second electrode is operable as the register of said second protection circuit.

These and other objects are accomplished by a semiconductor device according to a second invention, including a semiconductor substrate of a first conductive type, a substrate bias generating circuit for generating a substrate bias to be applied to the semiconductor substrate, a CMOS circuit formed on the semiconductor substrate, a semiconductor controlled rectifier device for preventing a latch-up from occurring in the CMOS circuit, and a second protection circuit for preventing electrostatic breakdown from occurring in the CMOS circuit, the semiconductor controlled rectifier device comprising:

a first diffusion region of a second conductive type formed on the substrate and electrically coupled with a first power supply;

a second diffusion region of the first conductive type formed in said first diffusion region and electrically coupled with an input line;

a third diffusion region of the second conductive type surrounding said first diffusion region formed apart from said first diffusion region on the surface of the substrate and electrically coupled with a second power supply having different potential from the first power supply; and an electrode on the substrate except said first to third diffusion regions electrically coupled with the substrate bias generating circuit.

The semiconductor controlled rectifier device preferably comprises an bipolar transistor and said third diffusion region is operable as a collector of said bipolar transistor.

The semiconductor controlled rectifier device preferably comprises a resistor and a part of said second diffusion region is operable as the register of said second protection circuit.

The resistor preferably comprises a first electrode on said second diffusion region and electrically coupled with a control gate electrode in the CMOS circuit and a second electrode on said second diffusion region coupled with the input line, and a part of said second diffusion region between the first electrode and the second electrode is operable as the register of said second protection circuit.

BRIEF DESCRIPTION OF THE DRAWING

The objects and features of the invention may be understood with reference to the following detailed description of an illustrative embodiment of the invention, taken together with the accompanying drawings in which.

DESCRIPTION OF THE PREFERRED EMBODIMENTS

Figure 1:
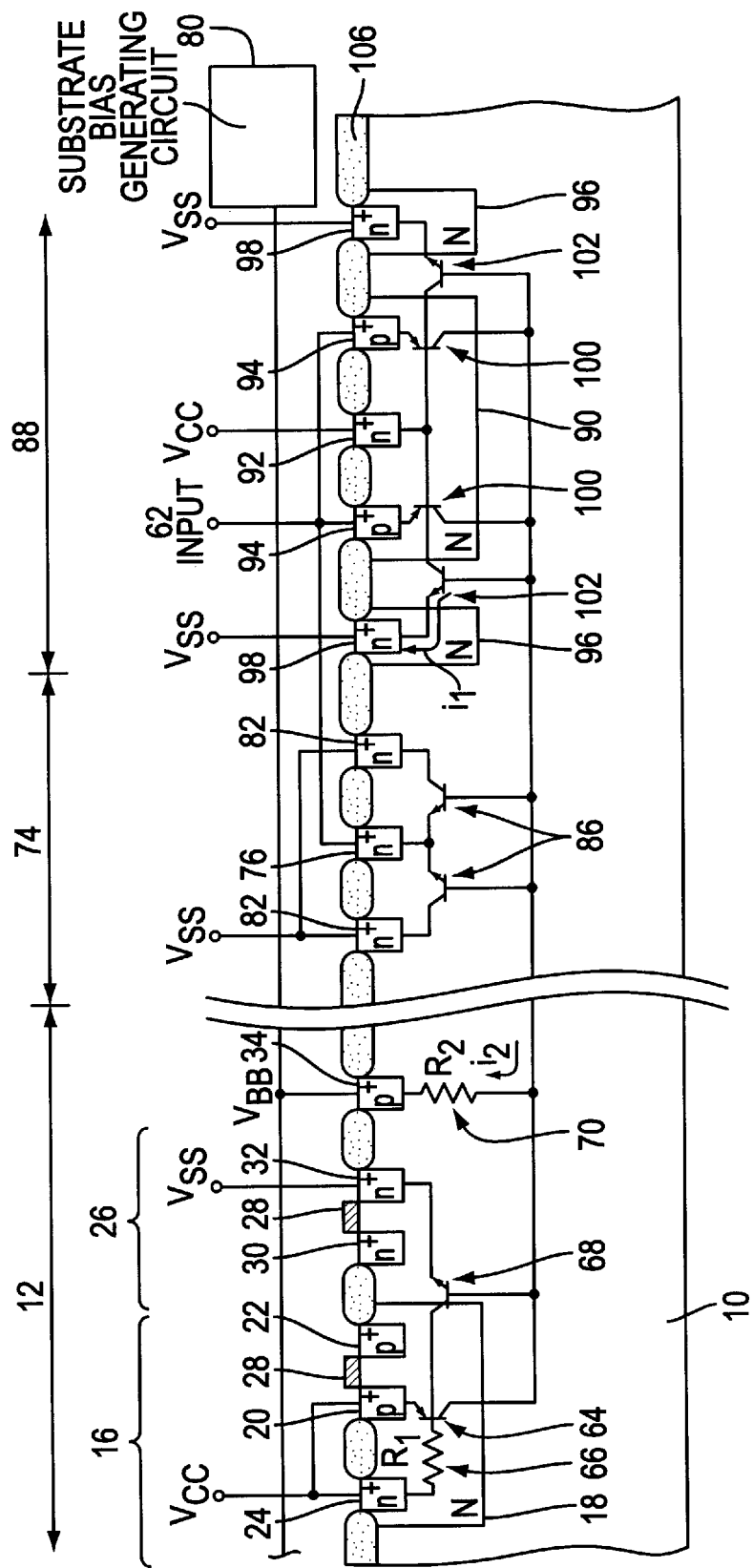
FIG. 1 is a cross-sectional view showing a semiconductor device according to a first embodiment of the present invention.

Referring to the drawings, preferred embodiments of the semiconductor devices according to the present invention are shown. Each drawing roughly shows the shape or the arrangement of parts of the semiconductor device, and hatching is partly omitted from sectional views, in order to understand the present invention.

A first comparative example, a second comparative example and third comparative example are briefly shown to understand the present invention more easily before the preferred embodiments are described.

First Comparative Example

Figure 19:
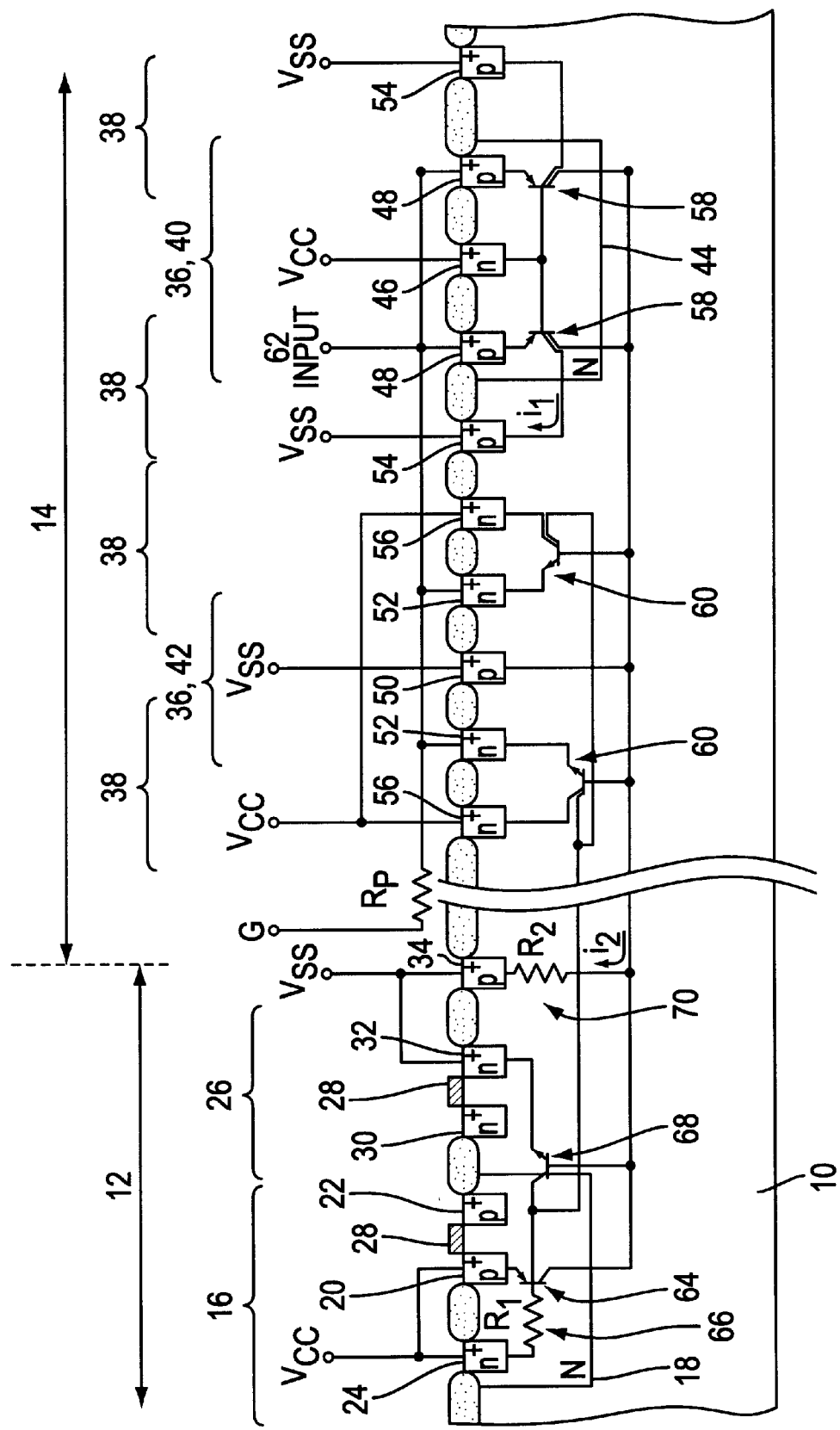
FIG. 19 is a cross-sectional view showing a semiconductor device according to a first comparative example.
Figure 20:
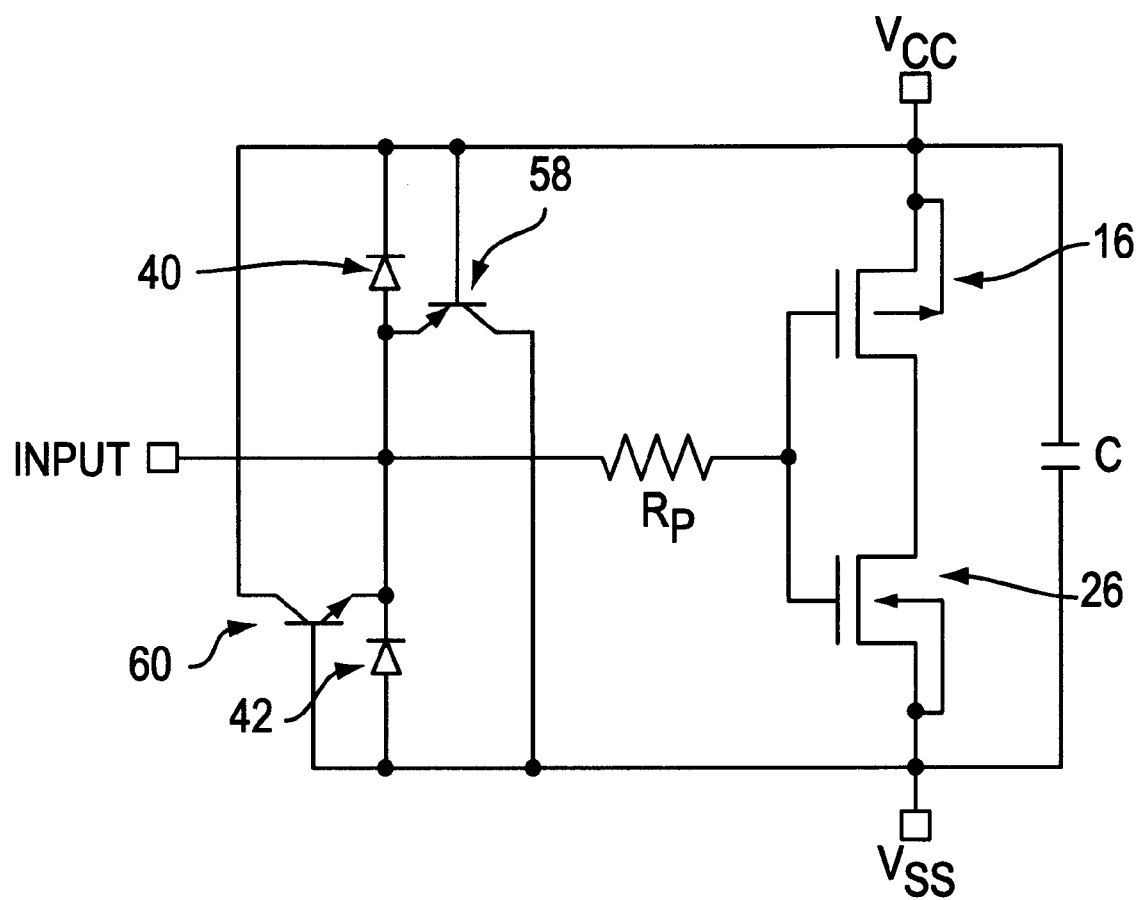
FIG. 20 is a circuit diagram showing a semiconductor device according to a first comparative example.

FIG. 19 is a cross-sectional view showing a semiconductor device including diffusion regions, electrodes and parasitic circuit, according to a first comparative example. FIG. 20 is a circuit diagram showing a semiconductor device according to a first comparative example. Referring to FIG. 19 and FIG. 20 of the drawings, a first comparative example of a semiconductor device having a latch-up protection circuit which is a conventional multi-collector type parasitic bipolar transistor without a substrate bias generating circuit is shown.

Structure

The semiconductor device of the first comparative example, as shown in FIG. 19, has an internal CMOS circuit 12 and an input circuit 14 on a p-type substrate 10. The input circuit 14 comprises an electrostatic breakdown protection circuit 36 and a latch-up protection circuit 38. There are a plurality of internal CMOS circuits on the p-type substrate in addition to the internal CMOS circuit 12 shown in FIG. 19.

A p-type MOS transistor (PMOSTr) 16 of the internal circuit 12 is formed in an n-type well (Nwell) 18 on the p-type substrate 10. A supply voltage Vcc of 3.0 V is applied to a source (p+) 20 and the Nwell 18 in the PMOSTr 16 through a highly doped impurity region (n+) 24, which is doped with more n-type impurities than the Nwell 18.

An n-type MOS transistor (NMOSTr) 26 of the internal circuit 12 is formed on the p-type substrate 10. A ground voltage Vss of 0 V is applied to a drain (n+) 32 and the p-type substrate 10 in the NMOSTr 26 through a highly doped impurity region (p+) 34, which is doped with more p-type impurities than the p-type substrate 10.

A first pn junction diode (p-type diode) 40 comprising the electrostatic breakdown protection circuit 36 is formed in an Nwell 44 on the p-type substrate 10. A supply voltage Vcc of 3.0 V is applied to the Nwell 44 through a highly doped impurity region (n+) 46, which is doped with more n-type impurities than the Nwell 44. The p-type diode 40 has a p-type impurity diffusion region (p+) 48 in the Nwell 44. The p+48 is coupled with an input terminal 62 through an input line. The pn junction of the p-type diode 40 is formed at the surface between the p+48 and the Nwell 44 and forms a forward voltage junction against a terminal applied the supply voltage Vcc.

A second pn junction diode (n-type diode) 42 comprising the electrostatic breakdown protection circuit 36 is formed on the p-type substrate 10. A ground voltage Vss of 0 V is applied to the p-type substrate 10 through a highly doped impurity region (p+) 50, which is doped with more p-type impurities than the p-type substrate 10. The n-type diode has an n-type impurity diffusion region (n+) 52 on the p-type substrate 10. The n+52, is coupled with the input terminal 62 through an input line. The pn junction of the n-type diode 42 is formed at the surface between the n+52 and the p-type substrate 10, and forms a backward voltage junction against a terminal applied the ground voltage Vss.

In the first comparative example, the semiconductor device has a p-type impurity diffusion region (p+) 54 and an n-type impurity diffusion region (n+) 56 as a latch-up protection circuit. The p-type diode 40 is surrounded by the p-type region (p+) 54, which is supplied with the ground voltage Vss of 0V.

The n-type diode 42 is surrounded by the n-type region (n+) 56, which is supplied with the supply voltage Vcc of 3.0 V.

The input line is coupled with an unspecified gate electrode (shown as "G" in FIG. 19) in the internal CMOS circuit through a protection resistor Rp. The unspecified gate electrode is not limited to only the gate electrode 28 in the internal CMOS circuit shown in FIG. 19.

A capacitor C in FIG. 20 is mainly made by a junction between the drain 32 of the NMOSTr 26 and the Nwell 18 in the internal CMOS circuit shown in FIG. 19.

Parasitic Circuit

A parasitic circuit of a semiconductor device in the first comparative example will be described. In the semiconductor device of the first comparative example, a parasitic circuit is formed by combining a p-type substrate, a p-type impurity diffusion region, an Nwell and a n-type impurity diffusion region which comprise a semiconductor device.

For example, the source (p+) 20 of the PMOSTr 16 in the internal circuit 12, the Nwell 18 and the p-type substrate 10 respectively perform an emitter, a base and a collector, and form a pnp type first parasitic transistor (first parasitic Tr) 64. The base of the first parasitic Tr 64 is coupled with a supply voltage through the n+region 24 of the Nwell 18 in the internal circuit. A well-resistor (R1) 66 is parasitically formed between the base and the n+24.

The drain n+32 of the NMOSTr 26 in the internal circuit 12, the p-type substrate 10 and the Nwell 18 respectively perform an emitter, a base and a collector, and form a npn type second parasitic transistor (second parasitic Tr) 68. A substrate resistor (R2) 70 is parasitically formed between the p+region 34 of the p-type substrate 10 in the internal circuit 12 and the p-type substrate 10.

The p+region 48 of the p-type diode 40 in the electrostatic breakdown protection circuit 36, the n+region 46 and the p-type substrate 10 respectively perform a emitter, a base and a collector, and form a pnp type third parasitic transistor (third parasitic Tr) 58. The collector of the third parasitic Tr 58 is coupled with the p+region 54 of the latch-up protection circuit and the p+region 34 of the internal circuit 12, through the p-type substrate 10. The third parasitic Tr 58 performs as a multi-collector type transistor.

The n+region 52 of the n-type diode 42 in the electrostatic breakdown protection circuit 36, the p-type substrate 10 and the n+region 56 in the latch-up protection circuit respectively perform an emitter, a base and a collector, and form an npn type fourth parasitic transistor (fourth parasitic Tr) 60. The Nwell 18 in the internal CMOS circuit performs as a collector of the fourth parasitic Tr 60, so that the fourth parasitic Tr 60 performs as a multi-collector type transistor.

Latch-up Phenomenon and Operation of the Latch-up Protection Circuit

A latch-up phenomenon and the operation of the latch-up protection circuit will be described with reference to the semiconductor device of the first comparative example in the case where surge voltage occurs to the input terminal 62.

A surge current flowing from the input terminal 62 flows into the semiconductor device through the p+region 48 of the emitter in the third parasitic Tr 58. The surge current flows into the p-type substrate 10 as a collector current of the third parasitic Tr 58 as well as into the supply voltage Vcc through the n+region 46 as a base current of the third parasitic Tr 58. A part of the surge current flowing into p-type substrate 10 flows into the ground voltage ( shown as "Vss" in FIG. 19 and 20 ) through the p+region 54 of the latch-up protection circuit 38. The rest of the surge current flows into the ground voltage through the p+34 of the internal circuit 12.

When the surge current i1 flowing into the p+region 54 of the latch-up protection circuit is enough and the surge current i2 flowing into the p+region 34 in internal circuit 12 is sufficiently a little, the latch-up can be prevented from occurring in the internal circuit 12.

However, if the surge current i2 flowing into the p+region 34 in internal circuit 12 becomes greater, the surge current i2 generates a latch-up to the internal circuit 12 as follows.

When the surge current i2 becomes greater, and a potential difference between both ends of the substrate resistor R2 becomes larger and reaches a level for forward biasing between the base and the emitter of the second parasitic Tr 68, a base current flows in the second parasitic Tr 68. The second parasitic Tr 68 turns on and is supplied with a collector current from the supply voltage Vcc through the well-resistor R1. The potential difference between both ends of the well-resistor R1 becomes larger because of the collector current. When the potential difference between both ends of the well-resistor R1 reaches a level for biasing forward between the base and the emitter in the second parasitic Tr 64, a base current flows in the first parasitic Tr 64. The first parasitic Tr 64 turns on. Then, the base current and the collector current of the first parasitic Tr 64 and the second parasitic Tr 68 generate a positive feedback between each other and a latch-up.

In this view, the semiconductor device described as the first comparative example prevents a latch-up from occurring by forming the latch-up protection circuit 38 and decreasing the surge current i2 flowing into the internal circuit 12.

In the first comparative example, any parasitic bipolar transistor formed in the input circuit 14 performs a multi-collector type transistor.

When a negative surge voltage is applied to the input terminal, a surge current flows from n+region 52 of an emitter in the fourth parasitic Tr 60 into the semiconductor device. In this case, the surge current flowing into the internal circuit 12 can be decreased because a part of the surge current flows into the n+region 56 of the latch-up protection circuit, so that the latch-up can be prevented from occurring in the internal circuit 12.

Second Comparative Example

Figure 21:
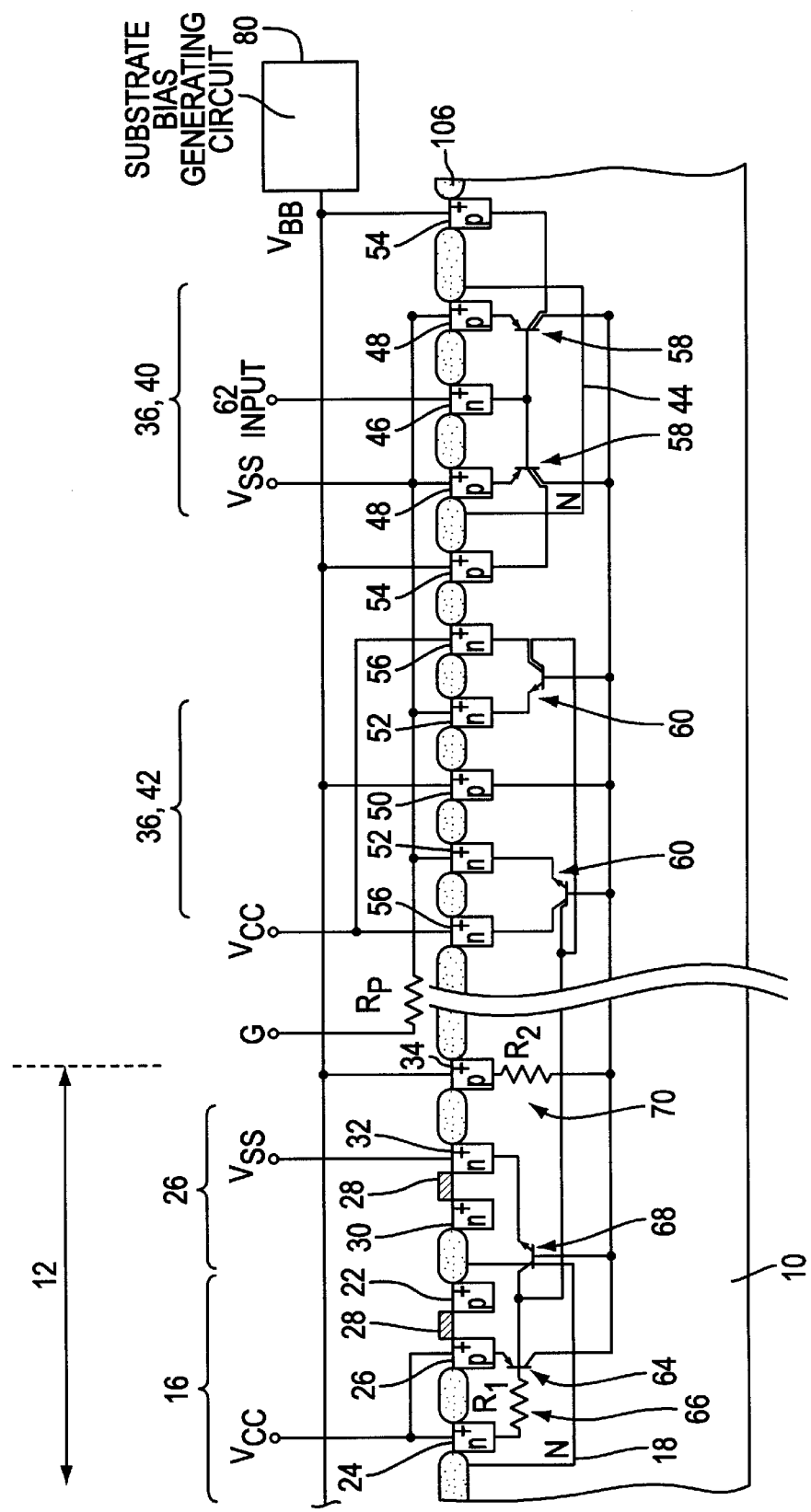
FIG. 21 is a cross-sectional view showing a semiconductor device according to a second comparative example.
Figure 22:
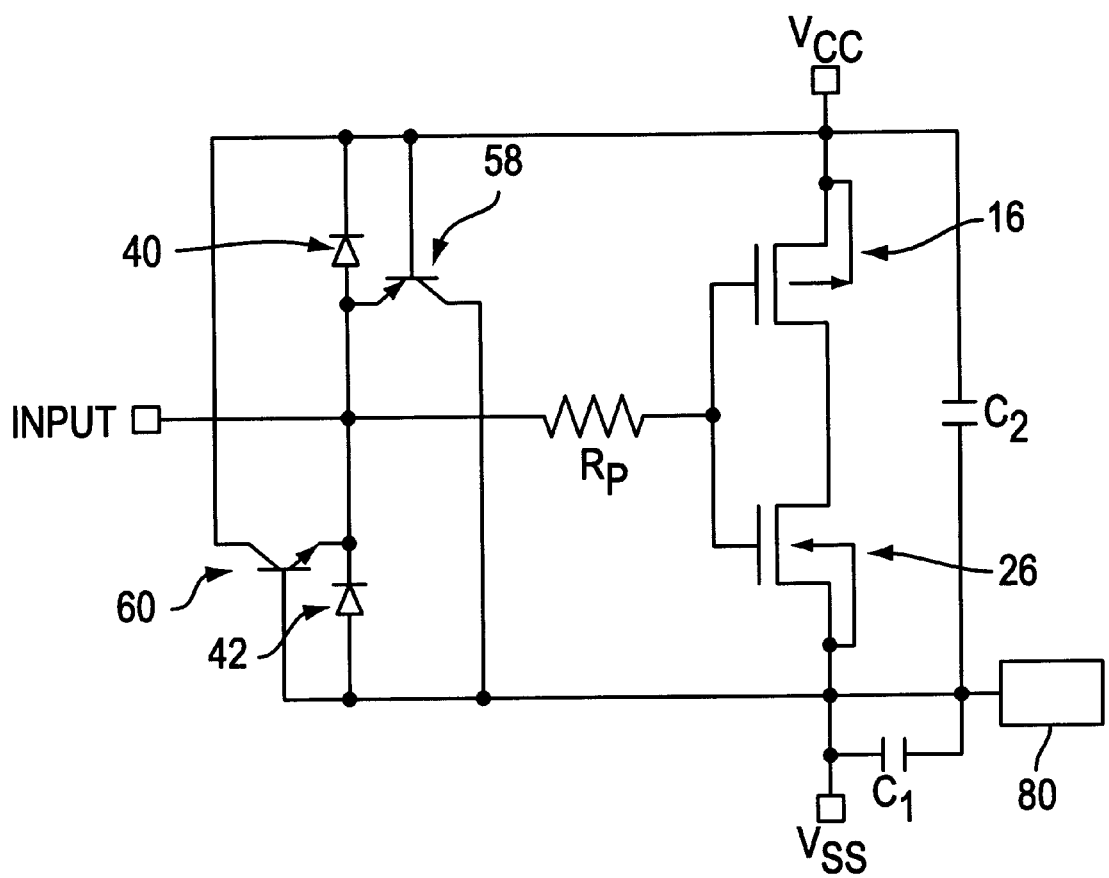
FIG. 22 is a circuit diagram showing a semiconductor device according to a second comparative example.

FIG. 21 is a cross-sectional view showing a semiconductor device including diffusion regions, electrodes and parasitic circuit, according to a second comparative example. FIG. 22 is a circuit diagram showing a semiconductor device according to a second comparative example. The same reference characters in FIGS. 21 and 22 as shown in FIGS. 19 and 20 designate the same parts. Referring to FIG. 21 and FIG. 22 of the drawings, a second comparative example of a semiconductor device further having a substrate bias generating circuit is shown.

The semiconductor according to the second comparative example has a substrate bias generating circuit 80. The substrate bias Vbb generated by the substrate bias generating circuit 80 is applied, through a internal potential line, to the highly doped impurity p-type diffusion region (p+) 34 in the internal circuit 12 and to the highly doped impurity p-type diffusion region (p+) 54 in the latch-up circuit. The substrate bias Vbb applied by the substrate bias generating circuit 80 to the p-type substrate 10 is lower than the potential of the ground Vss.

A capacitor C1 shown in FIG. 22 is mainly a junction capacitor between the source 32 of the NMOSTr 26 and the p-type substrate 10 shown in FIG. 21. The junction capacitor is necessarily formed because the ground voltage Vss is applied to the source 32.

A capacitor C2 shown in FIG. 22 is mainly a junction capacitor between the Nwell 18 of the PMOSTr 16 in the internal CMOS circuit and the p-type substrate 10 shown in FIG. 19. The junction capacitor is necessarily formed because the supply voltage Vcc is applied to the Nwell 18 through the n+region 24.

The semiconductor according to the second comparative example having the substrate bias generating circuit 80, unlike the first comparative example, can not prevent a latch-up from occurring by making a parasitic bipolar transistor of a multi-collector type. The reasons are as follows.

The operation in the case of a surge voltage applied to the semiconductor through the input terminal is described with reference to FIG. 21. A surge current flowing from the input terminal 62 flows into the semiconductor device through the p+region 48 of the emitter in the third parasitic Tr 58. The surge current flows into the p-type substrate 10 as a collector current of the third parasitic Tr 58 as well as into the supply voltage source (shown as "Vcc" in FIGS. 21 and 22) through the n+region 46 as a base current of the third parasitic Tr 58. A part of the surge current flowing into p-type substrate 10 flows into the substrate bias generating circuit 80 through the p+region 54.

However, in the substrate bias generating circuit 80, the capacity to supply current is originally small and the internal impedance as a power source is large. When the surge voltage is applied to the substrate bias generating circuit 80 through the p+region 54, the substrate bias Vbb itself is easily raised to a high potential. Then, the substrate bias Vbb has a forward voltage (Vf) in a pn junction that is higher than the ground potential and the pn junction between the p-type substrate 10 and the source 32 of the NMOSTr 26 in the internal circuit 12 is biased forward.

Consequently, as described in the first comparative example, a base current flows in the second parasitic Tr 68 and the second parasitic Tr 68 turns on. A collector current of the second parasitic Tr 68 is supplied from the supply voltage Vcc through the well-resistor R1. The potential difference between both ends of the well-resistor R1 becomes larger because of the collector current. When the potential difference between both ends of the well-resistor R1 reaches a level for forward biasing between the base and the emitter of the second parasitic Tr 64, a base current flows in the first parasitic Tr 64, and the first parasitic Tr 64 turns on. Then, the base current and the collector current of the first parasitic Tr 64 and the second parasitic Tr 68 generate a positive feedback between each other and a latch-up.

In this view, in the semiconductor having the substrate bias generating circuit 80, the substrate bias Vbb is easily raised because of the surge current. With the substrate bias generating circuit 80, it becomes difficult to prevent a latch-up from occurring in spite of a latch-up protection circuit.

A metal line (internal potential line), for supplying the substrate bias Vbb to the whole chip having the semiconductor device, is formed around other internal CMOS circuits as well as the internal circuit 12. In any internal CMOS circuit, PMOSTrs and NMOSTrs are arranged closely together, so that a base width of an npn type parasitic bipolar transistor (a second parasitic transistor in the second comparative example) is also minimum. Therefore, the current amplification factor (hFE) of the parasitic bipolar transistor becomes larger than that of peripheral circuits, and a latch-up in internal CMOS circuit is easier to provide for than in peripheral CMOS circuits. Hence, there is a possibility that, in a semiconductor device having a substrate bias generating circuit, once the substrate bias Vbb is raised, the latch-up occurs in unspecified internal CMOS circuits.

Adding a multi-collector type latch-up protection circuit, which is formed on a semiconductor device having no substrate bias generating circuit, to a semiconductor device having a substrate bias generating circuit causes the substrate bias Vbb because of a positive surge. The raised substrate bias Vbb affects an inner internal CMOS circuit through a metal line, and a latch-up occurs in an inner internal CMOS circuit. Then a latch-up, tolerance decrease more compared with a latch-up that occurs in peripheral CMOS circuits.

On the other hand, in a semiconductor device having a substrate bias generating circuit but not a latch-up protection circuit, a surge current flows easily into an internal CMOS circuit, and a latch-up easily occurs in peripheral internal CMOS circuits near input circuits.

It is necessary to enlarge widths of all bases of parasitic npn type transistors in an internal CMOS circuit so as to prevent a latch-up occurring because a latch-up tolerance in the whole semiconductor device depends on a minimum space between a PMOSTr and an NMOSTr. However, preventing a latch-up by enlarging the widths of the bases causes an increase in chip size and cost.

Therefore, an input circuit without the p-type diode described in the first comparative example is used in a semiconductor device having a substrate bias generating circuit. Because a parasitic bipolar transistor in inevitably forms using a p-type diode, an input circuit substantially comprises only n-type diodes. It is difficult, however, for a protection circuit having only n-type diodes to have sufficient tolerance. Reasons are as follows.

Third Comparative Example

Figure 23:
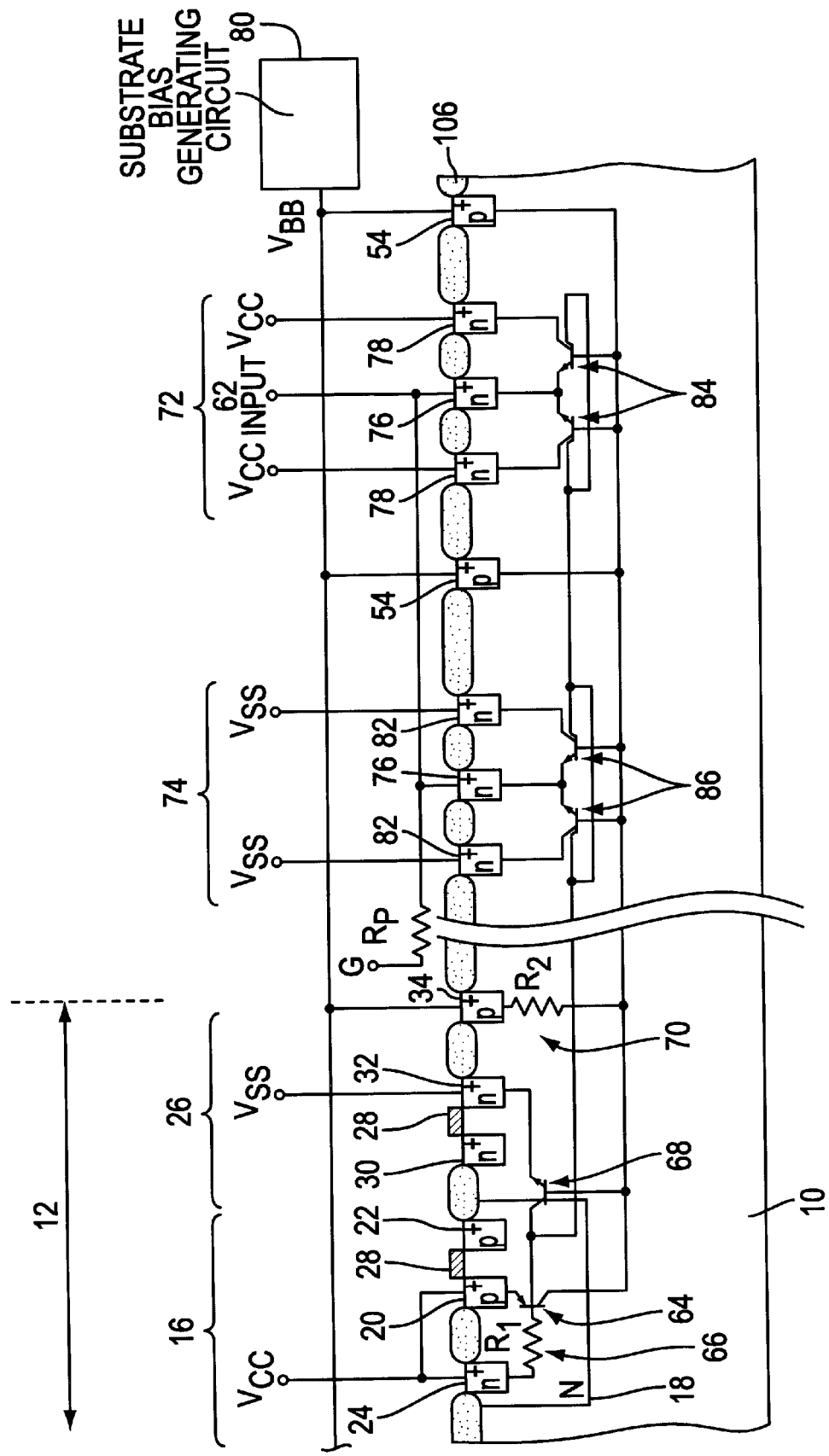
FIG. 23 is a cross-sectional view showing a semiconductor device according to a third comparative example.
Figure 24:
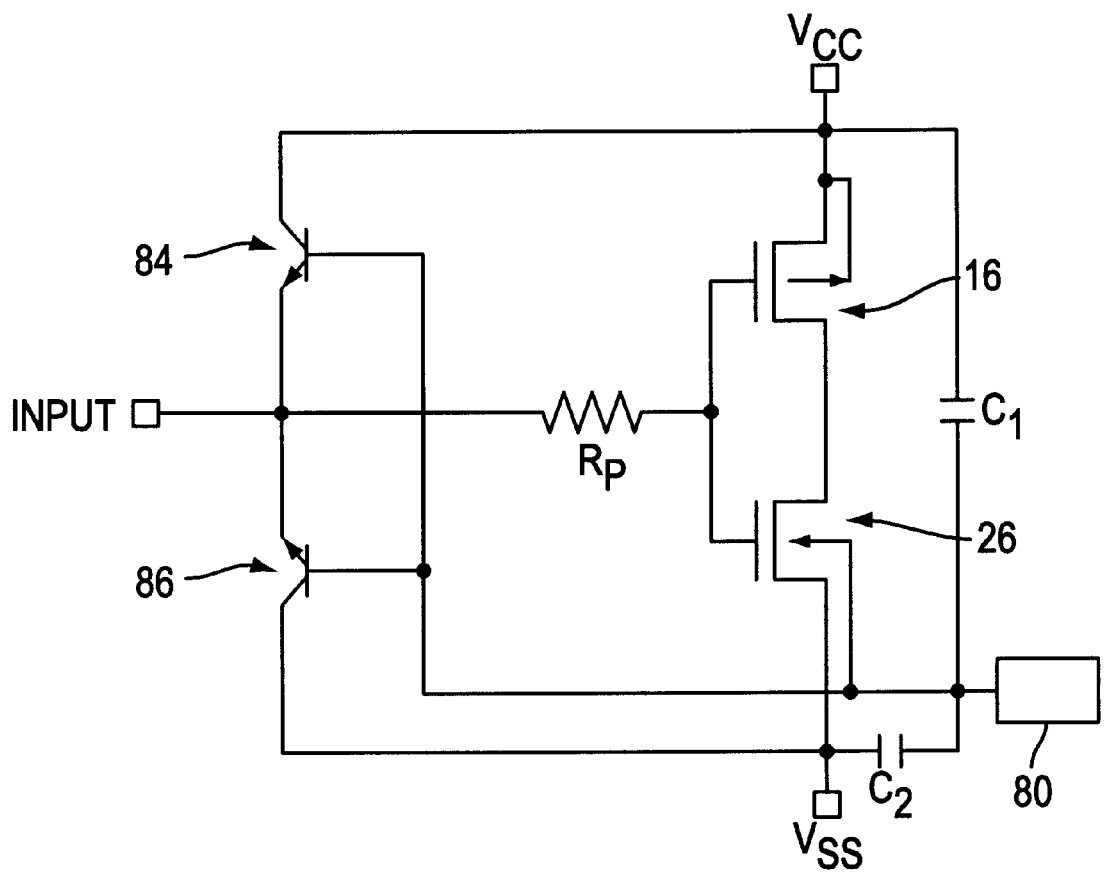
FIG. 24 is a circuit diagram showing a semiconductor device according to a third comparative example.

FIG. 23 is a cross-sectional view showing a semiconductor device including diffusion regions, electrodes and parasitic circuit, according to a third comparative example. FIG. 24 is a circuit diagram showing a semiconductor device according to a third comparative example. The same reference characters in FIGS. 23 and 24 as shown in FIGS. 19, 20, 21 and 22 designate the same parts of which explanations are omitted. Referring to FIG. 23 and FIG. 24 of the drawings, a third comparative example of a semiconductor device having a first input protection circuit 72 and a second protection circuit 74 comprised of n-type diodes as an electrostatic breakdown protection circuit is shown.

Structure

The semiconductor device of the third comparative example, as shown in FIG. 23, has a first input protection circuit 72 and a second protection circuit 74 in addition to an internal CMOS circuit 12.

The first input protection circuit 72 comprises a first highly doped n-type diffusion region (n+) 76 and a second highly doped n-type diffusion region (n+) 78 on the p-type substrate 10. The first n+region 76 is coupled with an input terminal through an input line. The second n+region 78 is supplied with a supply voltage Vcc.

The first n+region 76, the p-type substrate 10 and the second n+region 78 are respectively equivalent to an emitter, a base and a collector of a first npn type bipolar transistor (first protection Tr) 84.

The second input protection circuit 74 comprises the first n+region 76 and a third highly doped n-type diffusion region (n+) 82 on the p-type substrate 10. The first n+region 76 is coupled with an input terminal through an input line. The third n+region 82 is supplied with a ground voltage Vss. The first n+region 76, the p-type substrate 10 and the third n+region 82 are respectively equivalent to an emitter, a base and a collector of a second npn type bipolar transistor (second protection Tr).

Operation

An operation of the semiconductor device of the third comparative example will be described in the case where an electrostatic negative surge (negative surge) occurs at the input terminal 62.

The negative surge flowing from the input terminal 62 flows into the semiconductor device through the first n+region 76 of the first protection circuit 72 and the second protection circuit 74. The direction of the negative surge is forward for both base-emitter junctions of the first protection Tr 84 and the second protection Tr 86. The base current of the first protection Tr 84 and the second protection Tr 86 flows when the potential of the first n+region 76 decreases to a forward voltage Vf (approximately 0.6 V in the case of a silicon semiconductor) lower than that of the p-type substrate 10 because of the negative surge. The first and second protection Trs 84 and 86 turn on, and the negative surge is discharged to a supply voltage terminal ("Vcc" shown in FIG. 24) as a collector current of the first protection Tr 84 and to a ground voltage terminal ("Vss" shown in FIG. 24) as a collector current of the second protection Tr 86.

In this view, the semiconductor device according to the third comparative example can quickly let the negative surge flow into both source lines because the voltages of both npn Trs 84 and 86 are decreased by the forward voltage Vf from the negative surge and turn on.

An operation of the semiconductor device of the third comparative example will be described in the case where an electrostatic positive surge (positive surge) occurs at the input terminal 62.

The positive surge flowing from the input terminal 62 flows into the semiconductor device through the first n+region 76 of both protection circuits 72 and 74. The direction of the positive surge is backward for both base-emitter junctions of the first protection Tr 84 and the second protection Tr 86. It is necessary that the potential of the first n+region 76 increase by a breakdown voltage of a pn junction (approximately 10-odd V in the case of a general semiconductor device) higher than the voltage of the p-type substrate 10. Once the base-emitter junction is broken down, the first protection Tr 84 and the second protection Tr 86 are turned on by the positive surge.

The response of the first and second protection Trs 84 and 86 is delayed until the potential of the first n+region 76 is increased by the breakdown voltage. A surge voltage is applied to gates of the internal CMOS circuit while the response is delaying. Consequently, in the worst case, a gate oxide film could be broken down because of the surge voltage.

Generally, a protection resistor Rp is formed between an input terminal and a gate of an internal CMOS circuit so as to delay the surge voltage to be applied to the gate of the internal CMOS circuit while the response is delayed.

When the resistance of the resistor Rp becomes larger, it delays an input signal transferring under normal operation. Therefore, it is not appropriate for a semiconductor device requiring a high-speed operation to have a protection resistor with large resistance.

Instead of making the resistor Rp larger, there is a way of forming a pnp-type bipolar transistor as an input protection circuit by using a p-type diode. The pnp-type bipolar transistor responds to a positive surge with a forward voltage. This semiconductor device with such a pnp-type transistor can avoid an electrostatic breakdown due to a positive surge.

This pnp-type bipolar transistor, however, is the p-type diode inevitably forming the third parasitic Tr 58 mentioned in the above comparative example 2. Therefore, forming the pnp-type bipolar transistor makes it difficult to keep a latch-up tolerance because of the increase in the substrate voltage Vbb.

In this view, although an electrostatic breakdown tolerance against surge voltage can be maintained, a latch-up tolerance can not be maintained by using a p-type diode in a p-type substrate as an input protection circuit in a semiconductor device having a substrate voltage generating circuit therein. On the other hand, although the latch-up tolerance can be maintained by not using the p-type diode, the electrostatic breakdown tolerance can not be maintained for high-speed operation.

Further, although an electrostatic breakdown tolerance against surge voltage can be maintained, a latch-up tolerance can not be maintained by using an n-type diode in an n-type substrate. On the other hand, although the latch-up tolerance can be maintained by not using the n-type diode, the electrostatic breakdown tolerance can not be maintained for high-speed operation.

First Preferred Embodiment

Figure 2:
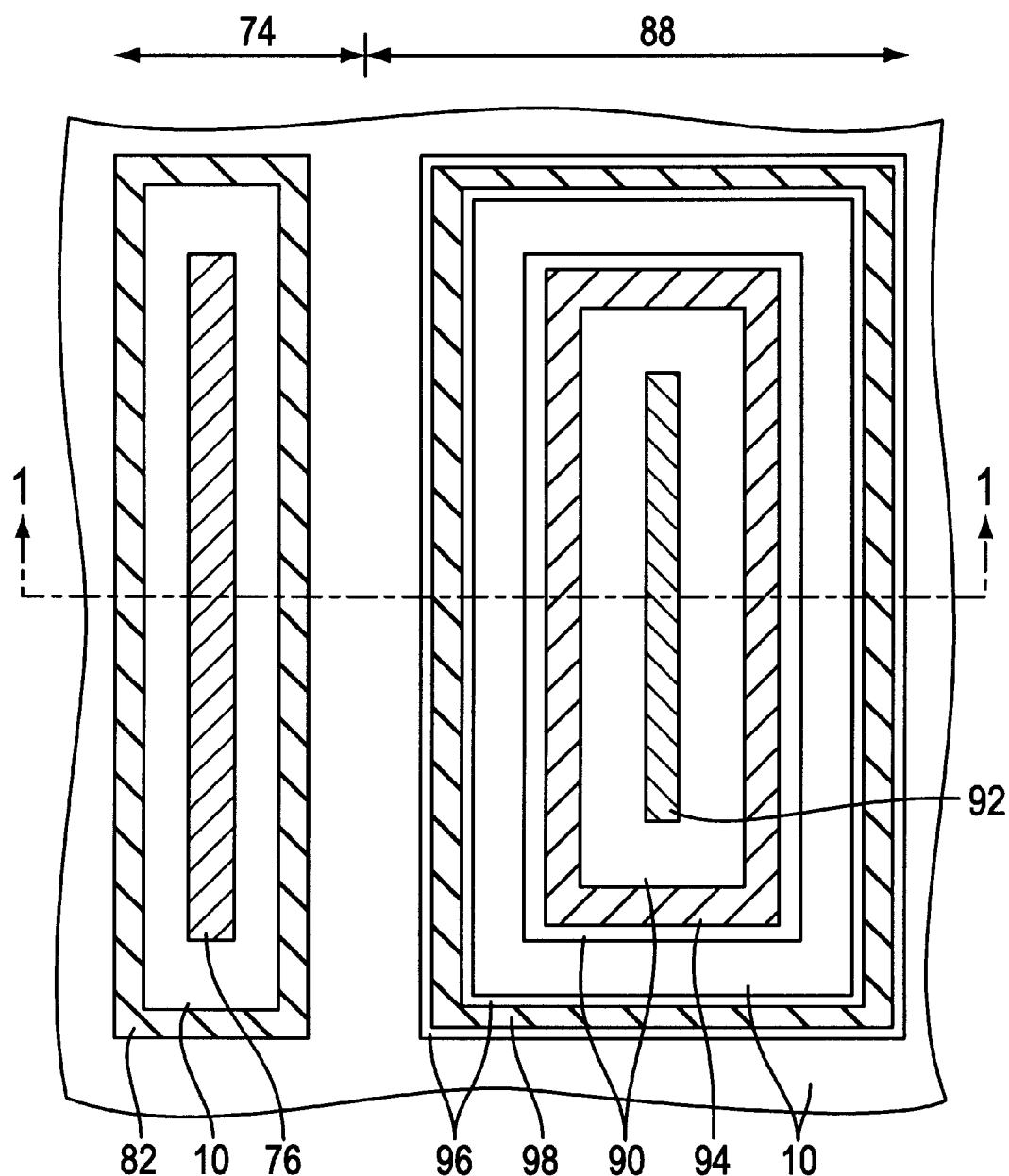
FIG. 2 shows a schematic pattern layout of the semiconductor device according to the first embodiment of the present invention.

Referring to FIG. 1 and FIG. 2, a first preferred embodiment of the semiconductor devices according to the present invention is shown. FIG. 1 is a cross-sectional view showing a typical semiconductor device including diffusion regions, electrodes and a parasitic circuit, according to a first embodiment of the present invention. FIG. 2 shows a schematic pattern layout of the semiconductor device according to the first embodiment of the present invention. The sectional view of the electrostatic breakdown protection device 74 and the latch-up protection device 88 in FIG. 1 is sectioned at the 1—1 line shown in FIG. 2. In FIG. 2, hatching is partly used in spite of the plane pattern, so as to understand the present invention more easily.

The same parts in the first embodiment as the first, second and third comparative examples are shown with the same reference characters and their explanations are omitted.

Structure of the First Preferred Embodiment

The semiconductor device according to the first embodiment, as shown in FIG. 1, has a substrate voltage generating circuit 80 for generating a substrate bias to be applied to a p-type substrate 10, a CMOS internal circuit 12, an electrostatic breakdown protection device (tolerance device) 74 for preventing the CMOS internal circuit 12 from being electrostatically broken down and a latch-up protection device (protection device) 88 for preventing a latch-up from occurring in the CMOS internal circuit 12. The detail of the CMOS circuit 12 is omitted as it is the same as that in the first comparative example. The tolerance device 74 is the same as the second input protection circuit 74 in the third comparative example, of which the second protection Tr 86 as the parasitic circuit is also the same as that of the third comparative example.

The protection device 88 has an n-type first diffusion region (Nwell) 90 on the p-type substrate, which has a highly doped n-type second diffusion region (n+) 92, which is doped with more n-type impurities than the Nwell 90, and has a p-type third diffusion region 94, which is separated from the second diffusion region 92. An n-type fourth diffusion region (Nwell) 96 is formed at a region substantially surrounding but separated from the first diffusion region 90 on a surface of the p-type substrate 10. The plane pattern in FIG. 2 of the fourth diffusion region 96 looks like a quadrilateral shape surrounding the first diffusion region (Nwell) 90.

The third diffusion region 94 is coupled with a input line. The second diffusion region (n+) 92 is coupled with a first supply line supplied with a supply voltage Vcc of 3.0 V. The fourth diffusion region (Nwell) 96 is coupled with a second supply line applied a ground voltage Vss of 0V which is supplied with through a highly doped diffusion region (n+) 98, which is doped with more doped n-type impurities than the fourth diffusion region 96.

In the first embodiment, an internal bias generating line supplied with a substrate bias Vbb generated by the substrate bias generating circuit 80 is coupled with the p-type substrate 10 through a highly doped p-type diffusion region (p+) 34 on the outside of the protection device 88. The substrate bias Vbb of the p-type substrate 10 is pulled down to a lower potential than the ground voltage Vss.

Parasitic Circuit in the First Embodiment

A parasitic circuit in the first embodiment will be described as follows. The parasitic circuits formed in the internal circuit 12 and the tolerance device 74 are the same as those of the first and second comparative examples, of which explanation is omitted.

With regard to the protection device 88, the third diffusion region (p+) 94, the first diffusion region (Nwell) 90 and the p-type substrate 10 respectively correspond to an emitter, a base and a collector and form an npn-type third parasitic transistor (third parasitic Tr) 100.

The fourth diffusion region (Nwell) 96, the p-type substrate 10 and the first diffusion region (Nwell) 90 respectively correspond to an emitter, a base and a collector and form an npn-type fourth parasitic transistor (fourth parasitic Tr) 102, which is shown at two places in FIG. 1.

The n-type diffusion region 90 including the p-type third diffusion region 94 and the second diffusion region 92, the p-type substrate 10 and the fourth diffusion region 96 form a Semiconductor Controlled Rectifier (SCR) device. Namely, the third parasitic Tr 100 and the fourth parasitic Tr 102 form the parasitic SCR.

Operation of the First Embodiment

A latch-up phenomenon and the operation of the protection device 88 will be described with reference the case where a positive surge voltage occurs at the input terminal 62 according to the first embodiment.

A surge current flowing from the input terminal 62 flows into the semiconductor device through the third diffusion region (p+) 94 of the protection device 88. The pn junction between the third diffusion region (p+) 94 and the first diffusion region (Nwell) 90 corresponds to a forward bias for the positive surge. The pn junction responds at the time when the potential of the third diffusion region (p+) 94 increases to a forward voltage Vf higher than that of the first diffusion region (Nwell) 90. Then, the surge current can be discharged quickly to the supply voltage Vcc as the base current of the third parasitic Tr 100. Consequently, the semiconductor device according to the first embodiment can prevent a transient voltage from being applied to a gate and has a sufficient electrostatic break down tolerance without a protection resistor having large resistance. The transient voltage generated by the break down is described in the third comparative example.

A part of of the surge current flows into the p-type substrate 10 as a collector current of the third parasitic Tr 100. When the potential of the p-type substrate 10 increases to a forward voltage Vf higher than that of the fourth diffusion region 96 because of the collector current, a base-emitter junction of the fourth parasitic Tr is biased forward, and the base current flows into the fourth parasitic Tr. Namely, the surge current flowing into the p-type substrate is discharged to the ground voltage Vss as the base current of the fourth parasitic Tr through the highly doped diffusion region (n+) 98. The fourth diffusion region 96 is formed by surrounding the first diffusion region (Nwell) 90 having the third diffusion region (p+) 94, so that the surge current flowing into the p-type substrate 10 is almost completely discharged from the fourth diffusion region 96 (the current is corresponding to the current i1 in the first comparative example). Therefore, the region where the substrate potential Vbb is pulled up by the surge current is substantially limited within the region surrounded by the fourth diffusion region 96. Consequently, the semiconductor device according to the first embodiment can prevent the substrate potential of the highly doped p-type diffusion region (p+) 34 from increasing, which is coupled with the substrate bias generating circuit 80 on the outside of the protection device 88.

As mentioned above, the positive surge flowing from the input terminal 62 is almost completely be discharged as the current i1 within the protection device 88, and the current i2 flowing into the internal circuit 12 is reduced and the latch-up is prevented from occurring in the internal circuit 12.

On the other hand, if a negative surge voltage is applied to an input terminal, as mentioned in the third comparative example, the negative surge current can quickly be discharged by the tolerance device 74. The tolerance device is formed with a conventional multicollector type latch-up protection circuit so that the latch-up can be prevented from generating.

Consequently, the semiconductor device according to the first embodiment has a tolerance to the electrostatic break down and the latch-up against both positive and negative surges.

Second Preferred Embodiment

Figure 3:
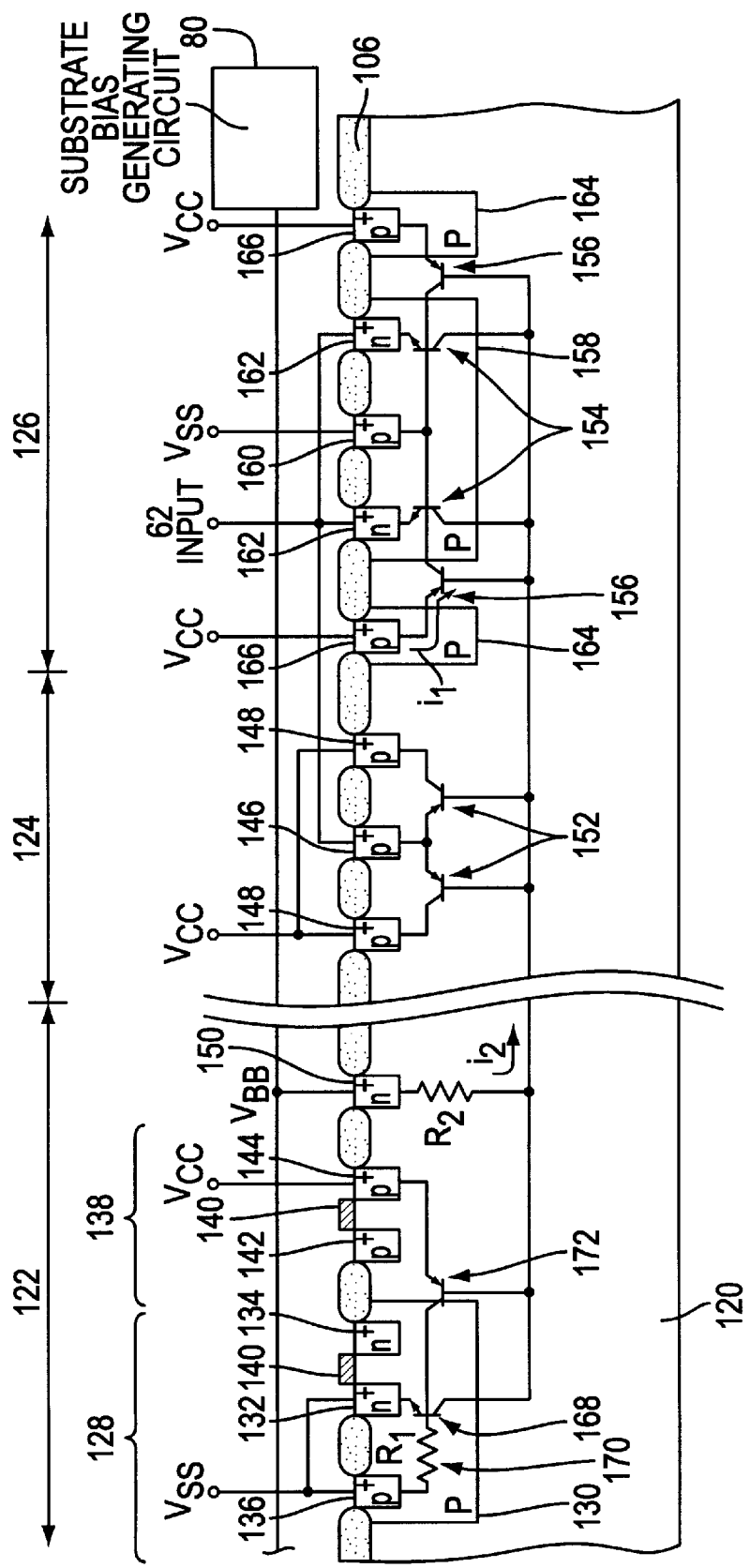
FIG. 3 is a cross-sectional view showing a semiconductor device according to a second embodiment of the present invention.
Figure 4:
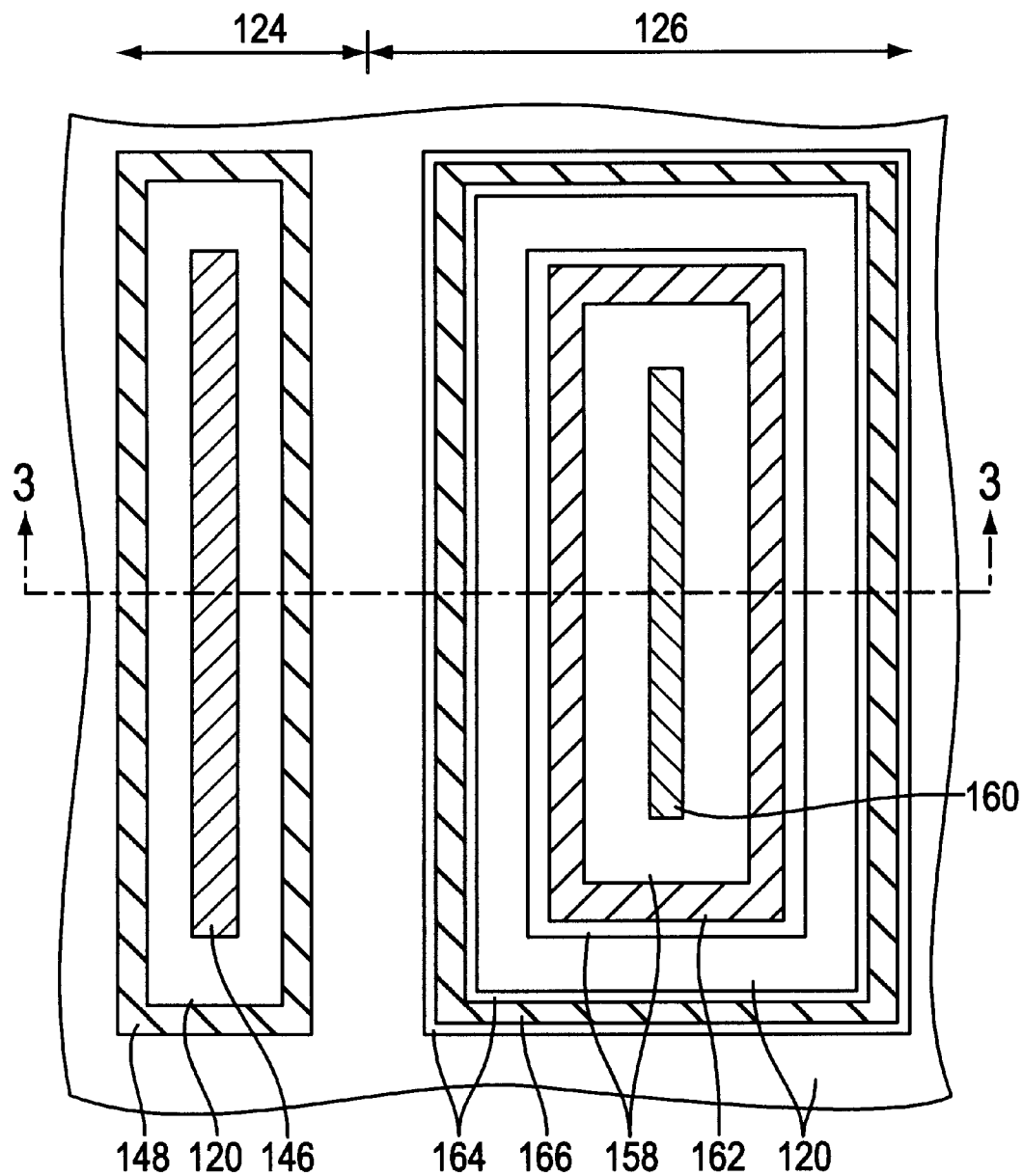
FIG. 4 shows a schematic pattern layout of the semiconductor device according to the second embodiment of the present invention.

Referring to FIG. 3 and FIG. 4, a second preferred embodiment of the semiconductor devices according to the present invention is shown. FIG. 3 is a cross-sectional view showing a typical semiconductor device including diffusion regions, electrodes and a parasitic circuit, according to a second embodiment of the present invention. FIG. 4 shows a schematic pattern layout of the semiconductor device according to the second embodiment of the present invention. The sectional view of the electrostatic breakdown protection device 124 and the latch-up protection device 126 in FIG. 3 is sectioned at the 3—3 line shown in FIG. 4. In FIG. 4, field oxide films 106, electrodes and so on are omitted and the hatching is used in spite of the plane pattern, and not sectional view, so as to understand the present invention more easily.

Structure of the Second Embodiment

The semiconductor device according to the second embodiment has reversed conductivity type and reversed coupling relation between the supply voltage Vcc and the ground voltage Vss as to those of the first embodiment.

The semiconductor device according to the second embodiment, as shown in FIG. 3, has a substrate voltage generating circuit 80 for generating a substrate bias to be applied to an n-type substrate 120, a CMOS internal circuit 122, an electrostatic breakdown protection device (tolerance device) 124 for preventing the CMOS internal circuit 122 from being electrostatically broken down and a latch-up protection device (protection device) 126 for preventing a latch-up from occurring in the CMOS internal circuit 122. Generally there are a plurality of internal circuits (not shown in FIG. 3) on the n-type substrate 120.

An n-type MOS transistor (NMOS Tr) 128 of the CMOS internal circuit 122 is formed in a p-type well region (Pwell) 130 on the n-type substrate 120. The ground voltage Vss of 0 V is applied to the drain (n+) 132 of the NMOS Tr 128 and the Pwell 130. The ground voltage Vss is applied to the Pwell 130 through a highly doped p-type diffusion region (p+) 136, which is doped with more doped p-type impurities than the Pwell 130.

A p-type MOS transistor (PMOS Tr) 138 of the CMOS internal circuit 122 is formed on the n-type substrate 120. A supply voltage Vcc of 3.0 V is applied to the source (p+) 144 of the PMOS Tr 138. The supply voltage Vbb is applied to the n-type substrate 120 through a highly doped n-type diffusion region (n+) 150, which is doped with more doped n-type impurities than the n-type substrate 120.

The tolerance device 124 has a first p-type diffusion region (p+) 146 and a second p-type diffusion region (p+) 148 on the n-type substrate 120. The first p-type diffusion region 148 is coupled with an input terminal through an input line. The supply voltage Vcc of 3.0 V is applied to the p-type diffusion region 148.

The protection device 126 has a p-type first diffusion region (Pwell) 158 on the n-type substrate 120. The first diffusion region 158 has a highly doped p-type second diffusion region (p+) 160, which is doped with more doped impurities than the first diffusion region 160, and has an n-type third diffusion region (n+) 162 separated from the second diffusion region 160. A p-type fourth diffusion region (Pwell) 164 is formed at region substantially surrounding but separated from the first diffusion region 158 on a surface of the n-type substrate 120.

The third diffusion region 162 is coupled with an input line. The second diffusion region (p+) 160 is coupled with a ground line as a first supply line and is supplied with he ground voltage Vss of 0 V. The fourth diffusion region (Pwell) 164 is coupled with a supply line as a second supply line and is supplied with the supply voltage Vcc of 3.0 V through a highly doped p-type diffusion region (p+) 166, which is doped with doped impurities than the fourth diffusion region 164.

In the second embodiment, an internal potential line supplied with a substrate bias Vbb generated by the substrate bias generating circuit 80 is coupled with the n-type substrate 120 through a highly doped n-type diffusion region (n+) 150 on the outside of the protection device 126. The substrate bias Vbb of the n-type substrate 120 is pulled up higher than the supply voltage Vcc.

Parasitic Circuit of the Second Embodiment

A parasitic circuit of the second embodiment will be described as follows. The npn and pnp conductivity type in the parasitic circuit according to the second embodiment is reversed to that in the first embodiment.

In the second embodiment, the drain (n+) 132 of the NMOS Tr 128 in the internal circuit 122, the Pwell 130 and the n-type substrate 120 respectively correspond to an emitter, a base and a collector and constitute an npn-type first parasitic Tr 168. The base of the first parasitic Tr 168 is coupled with a ground voltage through the highly doped p-type diffusion region (p+) 136 in the Pwell 130 of the internal circuit 122. A parasitic well resistor R1, 170 is formed between the base and the p-type highly doped diffusion region (p+) 136.

The source (n+) 144 of the PMOS Tr 138 in the internal circuit 122, the n-type substrate 120 and the Pwell 130 respectively correspond to an emitter, a base and a collector and constitute a pnp-type second parasitic Tr 172.

The p-type first diffusion region (p+) 146 in the tolerance device 124, the n-type substrate 120 and the p-type second diffusion region (p+) 148 respectively correspond to an emitter, a base and a collector and constitute a fifth parasitic bipolar Tr 152.

The third diffusion region (n+) 162 in the protection device 126, the first diffusion region (Pwell) 158 and the n-type substrate 120 respectively correspond to an emitter, a base and a collector and constitute an npn-type third parasitic Tr 154.

The fourth diffusion region (Pwell) 164, the n-type substrate 120 and the first diffusion region (Pwell) 158 correspond to a emitter, a base and a collector and constitute a pnp-type fourth parasitic Tr 156.

The n-type third diffusion region (n+) 162, the p-type first diffusion region (Pwell) 158 including the second diffusion region (p+) 160, the n-type substrate 120 and the p-type fourth diffusion region (Pwell) 164 form a SCR device. Namely, the third parasitic Tr 154 and the fourth parasitic Tr 156 form a parasitic SCR (Semiconductor Controlled Rectifier).

Operation of the Second Embodiment

In the Case Negative Surge Occurs

An operation of a latch-up phenomenon and the protection device 126 will be described with reference to the case of a negative surge voltage occurring at the input terminal 62 in the semiconductor device according to the second embodiment. The direction of the surge current i1 and i2 when the negative surge voltage occurs is in reverse to that of the surge current i1 and i2 shown in FIG. 1.

The negative surge flowing from the input terminal 62 flows into the semiconductor device through the third diffusion region (n+) 162 of the protection device 126. In this case, the pn junction between the third diffusion region (n+) 162 and the first diffusion region (Pwell) 158 corresponds to a forward bias for the negative surge. The pn junction responds at the time when the potential of the third diffusion region (n+) 162 decreases to a forward voltage Vf lower than that of the first diffusion region (Pwell) 158. Then, the surge current can be discharged quickly to the ground voltage Vss as the base current of the third parasitic Tr 154. Consequently, the semiconductor device according to the second embodiment can prevent a transient voltage from being applied to a gate and has a sufficient electrostatic break down tolerance without a protection resistor having large resistance. The transient voltage due to the break down is described in the third comparative example.

A part of of the surge current flows into the n-type substrate 120 as a collector current of the third parasitic Tr 154. When the potential of the n-type substrate 120 decreases to a forward voltage Vf lower than that of the fourth diffusion region 164, a base-emitter junction of the fourth parasitic Tr is biased forward and the base current flows into the fourth parasitic Tr. Namely, the surge current flowing into the n-type substrate 120 is discharged to the supply voltage source Vcc as the base current of the fourth parasitic Tr through the highly doped diffusion region (p+) 166. The fourth diffusion region 164 is formed by surrounding the first diffusion region (Pwell) 158 having the third diffusion region (n+) 162, so that the surge current flowing into the n-type substrate 120 is almost completely discharged from the fourth diffusion region 164 (the current corresponds to the current i1 in the first comparative example). Therefore, the region where the substrate potential Vbb is pulled down by the surge current is substantially limited within the region surrounded by the fourth diffusion region 164. Consequently, the semiconductor device according to the second embodiment can prevent the substrate potential of the highly doped n-type diffusion region (n+) 150 from decreasing, which is coupled with the substrate bias generating circuit 80 on the outside of the protection device 126.

As mentioned above, the negative surge flowing from the input terminal 62 can almost completely be discharged as the current i1 within the protection device 126, so that the current i2 flowing into the internal circuit 122 can be reduced and the latch-up can be prevented from occurring in the internal circuit 122.

In the Case Positive Surge Occurs

An operation of the semiconductor device according to the second embodiment will be described with reference to the case of a positive surge voltage applied to the input terminal 62.

The positive surge flowing from the input terminal 62 flows into the semiconductor device through the p-type first diffusion region (p+) 146 of the tolerance device 124. The direction of the positive surge corresponds to a forward bias for the base-emitter junction of the fifth parasitic Tr 152. The fifth parasitic Tr 152 is turned on by the positive surge at the time when the potential of the p-type first diffusion region (p+) 146 increases to a forward voltage Vf higher than that of the n-type substrate 120. Then, the surge current can be discharged quickly to a supply voltage source Vcc in FIG. 3 as the collector current of the fifth parasitic Tr 152. Consequently, the semiconductor device according to the second embodiment can achieve sufficient tolerance. Further the tolerance device is formed with a conventional multicollector typelatch-up protection circuit so that the latch-up can be prevented from occurring when a positive surge occurs.

Consequently, the semiconductor device according to the second embodiment has a tolerance of the electrostatic break down and the latch-up against both positive and negative surges.

Third Preferred Embodiment

Figure 5:
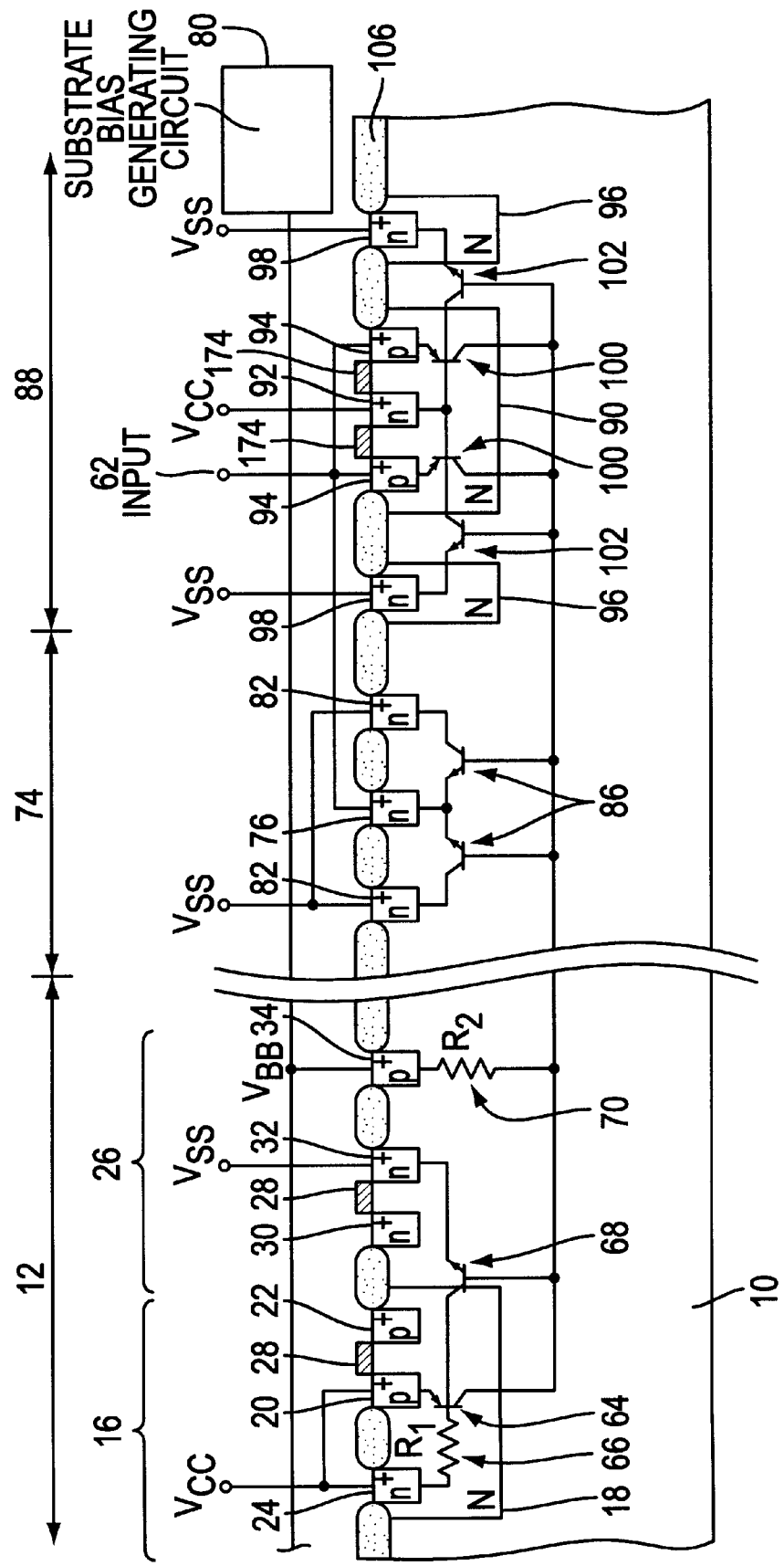
FIG. 5 is a cross-sectional view showing a semiconductor device according to a third embodiment of the present invention.
Figure 6:
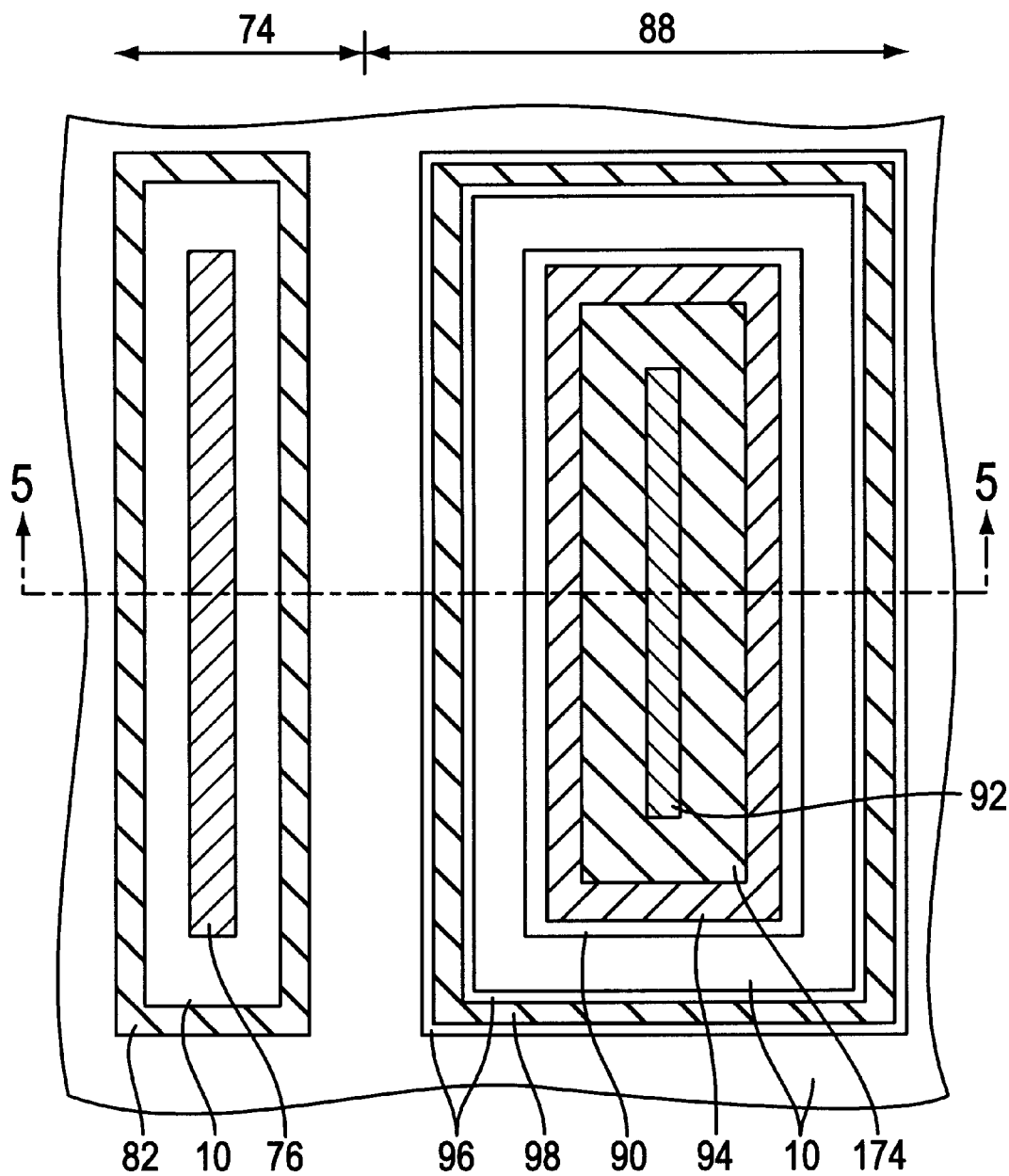
FIG. 6 shows a schematic pattern layout of the semiconductor device according to the third embodiment of the present invention.

Referring to FIG. 5 and FIG. 6, a third preferred embodiment of the semiconductor devices according to the present invention is shown. FIG. 5 is a cross-sectional view showing a typical semiconductor device including diffusion regions, electrodes and a parasitic circuit, according to a third embodiment of the present invention. FIG. 6 shows a schematic pattern layout of the semiconductor device according to the third embodiment of the present invention. The sectional view of the electrostatic breakdown protection device 74 and the latch-up protection device 88 in FIG. 5 is sectioned at the 5—5 line shown in FIG. 6. In FIG. 6, field oxide films 106, electrodes and so on are omitted and the hatching is partly used in spite of the plane pattern, and not sectional view, so as to understand the present invention more easily.

The semiconductor device according to the third embodiment has the same structure as the semiconductor device according to the first embodiment, except for a gate electrode 174 of a MOS Tr on a gate oxide film (not shown in FIG. 5) on a first diffusion region 90 between a second diffusion region 92 and a third diffusion region 94 in the protection device 88. The same parts in the third embodiment as in the first embodiment are shown with the same reference characters, and their explanations are omitted. An explanation of an operation of the third embodiment for the case of a surge voltage occurring is omitted because it is the same as that of the first embodiment.

In the semiconductor device according to the third embodiment, the second diffusion region 92 and the third diffusion region 94, respectively, perform like a source and a drain of a MOS Tr. A supply voltage Vcc of 3.0 V is applied to the gate electrode 174. The channel under the gate electrode 174 is kept closed (off). Consequently, the second diffusion region 92 and the third diffusion region 94 are separated from each other by the gate electrode 174.

By using the gate electrode 174, the distance between the second diffusion region 92 and the third diffusion region 94 can be shorter than that for the case of the field oxide film 106, which is formed according to the first embodiment. Consequently, the area occupied by the latch-up protection device can be reduced.

Fourth Preferred Embodiment

Figure 7:
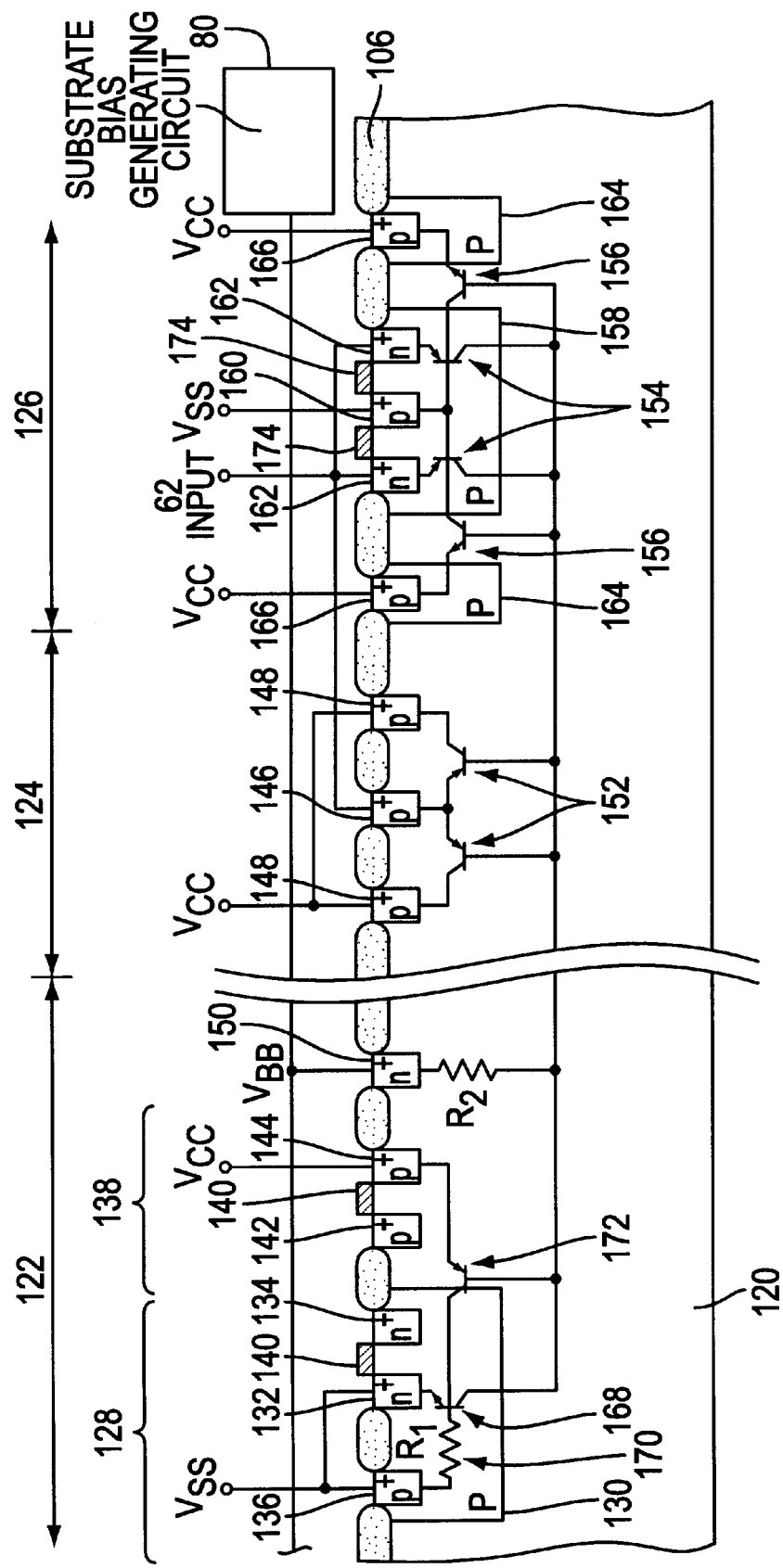
FIG. 7 is a cross-sectional view showing a semiconductor device according to a fourth embodiment of the present invention.
Figure 8:
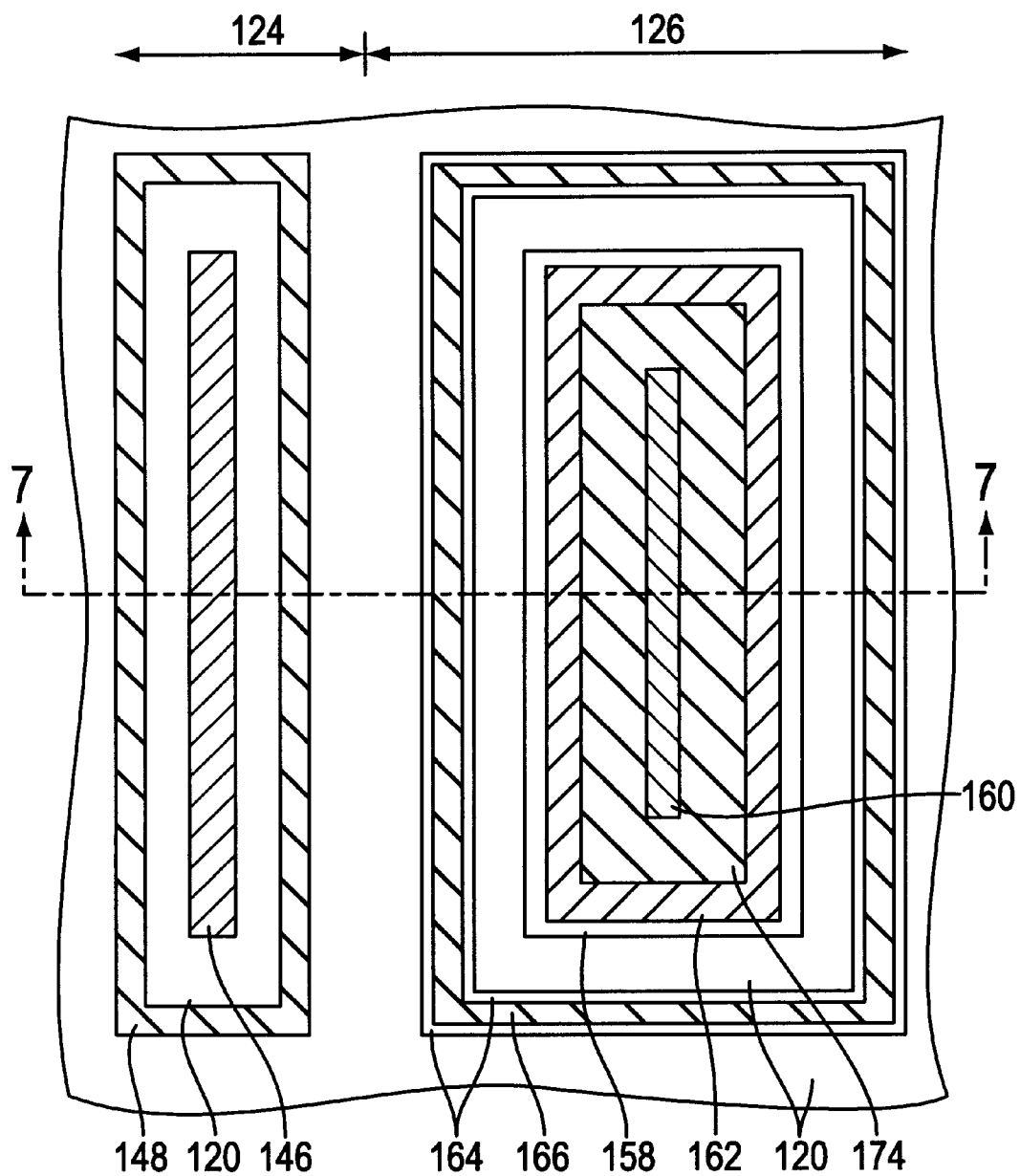
FIG. 8 shows a schematic pattern layout of the semiconductor device according to the fourth embodiment of the present invention.

Referring to FIG. 7 and FIG. 8, a fourth preferred embodiment of the semiconductor devices according to the present invention is shown. FIG. 7 is a cross-sectional view showing a typical semiconductor device including diffusion regions, electrodes and a parasitic circuit, according to a fourth embodiment of the present invention. FIG. 8 shows a schematic pattern layout of the semiconductor device according to the fourth embodiment of the present invention. The sectional view of the electrostatic breakdown protection device 124 and the latch-up protection device 126 in FIG. 7 is sectioned at the 7—7 line shown in FIG. 8. In FIG. 8, field oxide films 106, electrodes and so on are omitted and the hatching is partly used in spite of the plane pattern, and not the sectional view, so as to understand the present invention more easily.

The semiconductor device according to the fourth embodiment has the same structure as the semiconductor device according to the second embodiment except for a gate electrode 174 of a MOS Tr on a gate oxide film (not shown in FIG. 7) on a first diffusion region 158 between a second diffusion region 160 and a third diffusion region 162 in the protection device 126. The same parts in the fourth embodiment as in the second embodiment are shown with the same reference characters and their explanations are omitted. An explanation of an operation of the fourth embodiment for the case of a surge voltage occurring is omitted because it is the same as that of the second embodiment.

In the semiconductor device according to the fourth embodiment, the second diffusion region 160 and the third diffusion region 162, respectively, have similar structure to a source and a drain of a MOS Tr. A ground voltage Vss of 0 V is applied to the gate electrode 174. The channel under the gate electrode 174 is kept closed (off), so that the second diffusion region 160 and the third diffusion region 162 are separated by the gate electrode 174 from each other.

By using the gate electrode 174, the distance between the second diffusion region 160 and the third diffusion region 162 can be shorter than that for the case of the field oxide film 106 is formed according to the first embodiment. Consequently, the area occupied by the latch-up protection device can be reduced.

Fifth Preferred Embodiment

Figure 9:
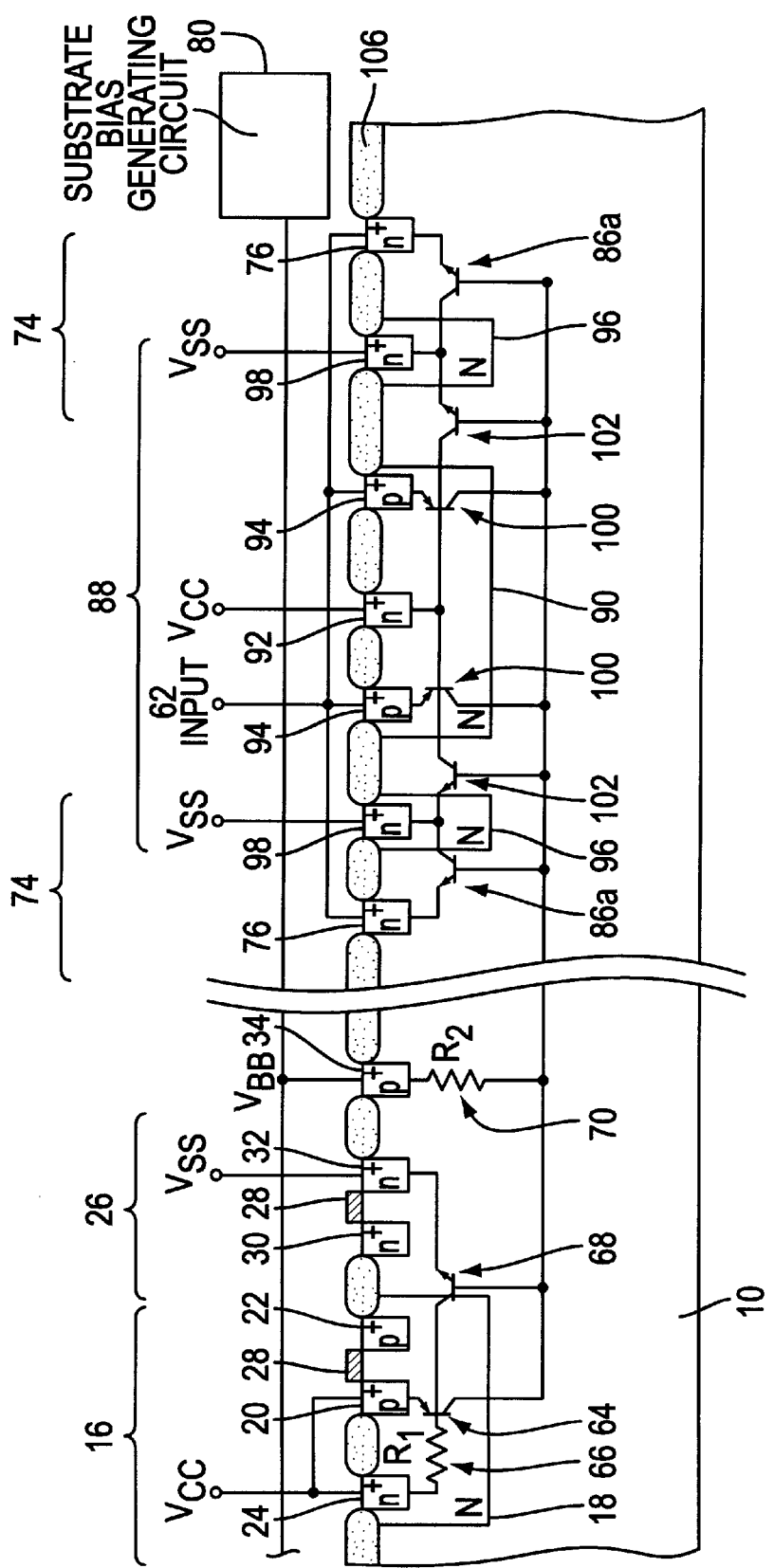
FIG. 9 is a cross-sectional view showing a semiconductor device according to a fifth embodiment of the present invention.
Figure 10:
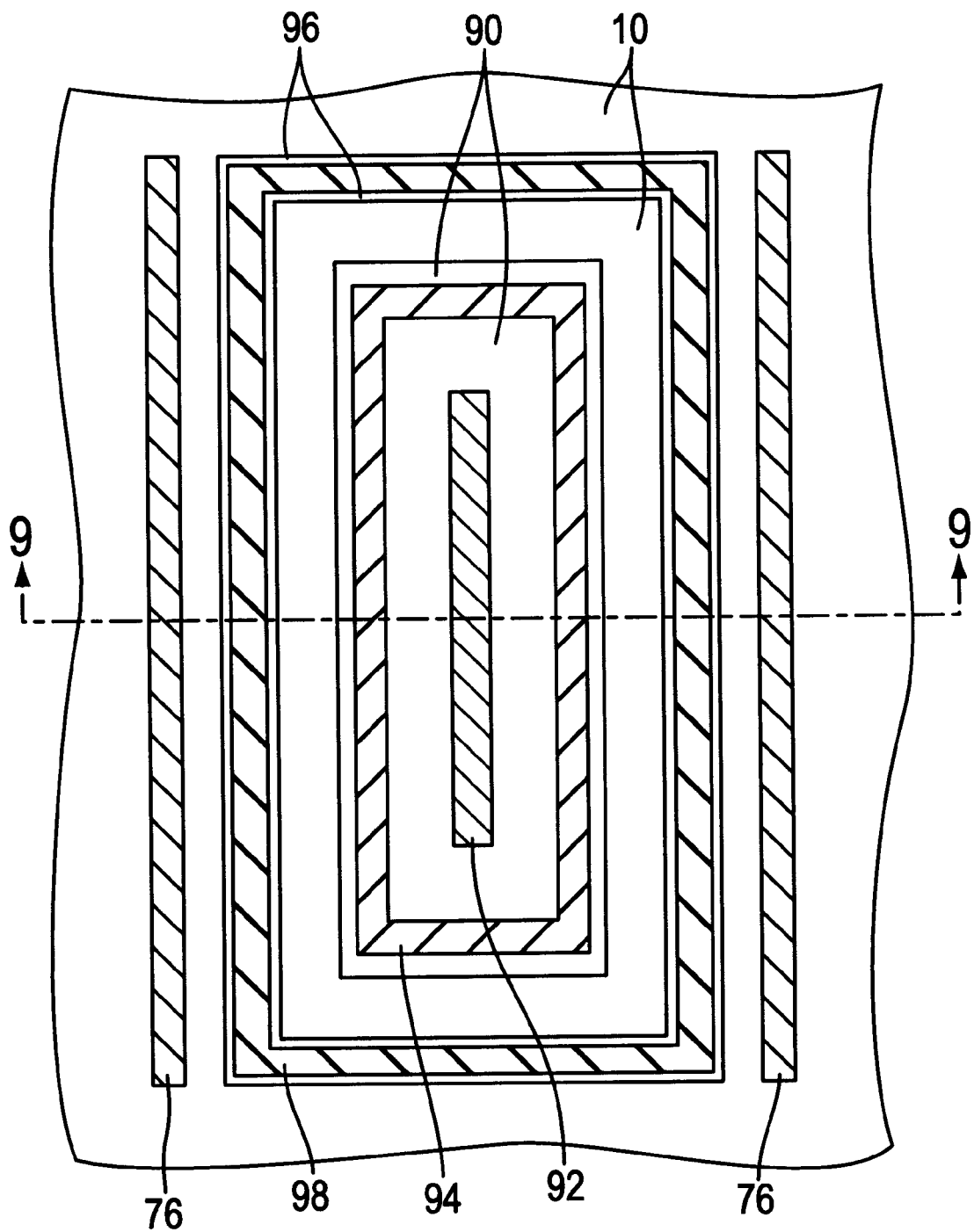
FIG. 10 shows a schematic pattern layout of the semiconductor device according to the fifth embodiment of the present invention.

Referring to FIG. 9 and FIG. 10, a fifth preferred embodiment of the semiconductor devices according to the present invention is shown. FIG. 9 is a cross-sectional view showing a typical semiconductor device including diffusion regions, electrodes and a parasitic circuit, according to a fifth embodiment of the present invention. FIG. 10 shows a schematic pattern layout of the semiconductor device according to the fifth embodiment of the present invention. The sectional view of the tolerance device 74 and the protection device 88 in FIG. 9 is sectioned at the 9—9 line shown in FIG. 10. In FIG. 10, field oxide films 106, electrodes and so on are omitted, and the hatching is used in spite of the plane pattern, and not sectional view, so as to understand the present invention more easily.

The semiconductor device according to the fifth embodiment has the same structure as the semiconductor device according to the first embodiment, except for the fourth diffusion region 96 in the protection device 88, which performs as a collector an npn-type parasitic bipolar Tr. The same parts in the fifth embodiment as in the first embodiment are shown with the same reference characters, and their explanations are omitted. An explanation of an operation of the fifth embodiment for the case of a surge voltage occurring is omitted because it is the same as that for the first embodiment.

In the semiconductor device according to the fifth embodiment, the fourth diffusion region 96 in the protection device 88, which is coupled with a ground voltage source Vss through the highly doped diffusion region 98, also performs as the second n-type diffusion region 82 in the tolerance device 74 according to the first embodiment shown in FIG. 1. The first n-type diffusion region 76, the p-type substrate 10 and the fourth diffusion region 96 respectively correspond to an emitter, a base and a collector and form an npn-type parasitic bipolar Tr 86a. A negative surge flowing from an input terminal corresponds to a forward bias for the parasitic bipolar Tr 86a. Consequently, the parasitic bipolar Tr 86a serves the same function as the tolerance device 74.

In the fifth embodiment, the fourth diffusion region 96 serves both as a part of the protection device 88 and as the second n-type diffusion region 82 of the tolerance device 74 in the first embodiment. Consequently, the area occupied by the protection device and the tolerance device can be reduced to an area smaller than that of the semiconductor device according to the first embodiment, while keeping the latch-up tolerance and the electrostatic break down tolerance.

Sixth Preferred Embodiment

Figure 11:
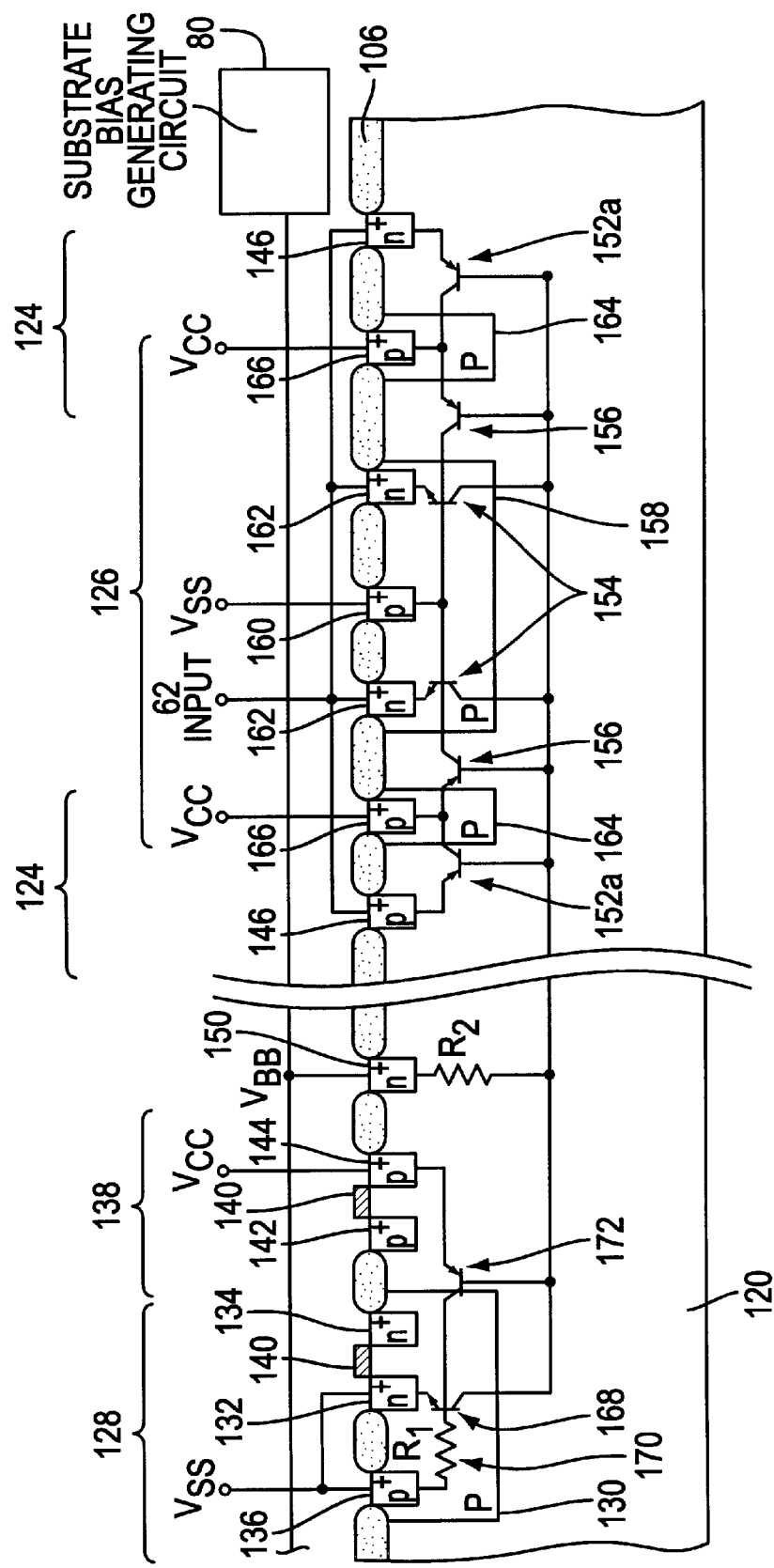
FIG. 11 is a cross-sectional view showing a semiconductor device according to a sixth embodiment of the present invention.
Figure 12:
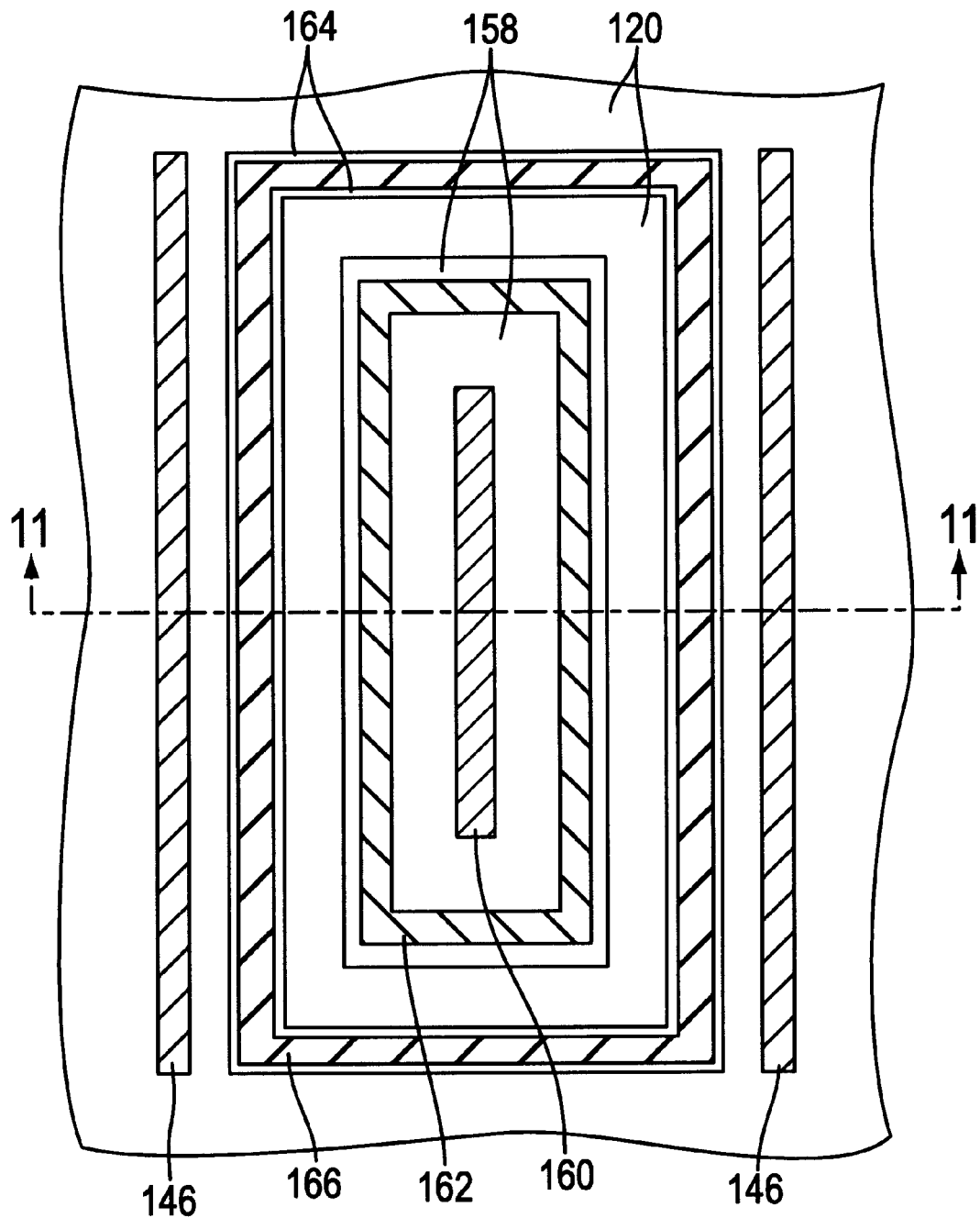
FIG. 12 shows a schematic pattern layout of the semiconductor device according to the sixth embodiment of the present invention.

Referring to FIG. 11 and FIG. 12, a sixth preferred embodiment of the semiconductor devices according to the present invention is shown. FIG. 11 is a cross-sectional view showing a typical semiconductor device including diffusion regions, electrodes and a parasitic circuit, according to a sixth embodiment of the present invention. FIG. 12 shows a schematic pattern layout of the semiconductor device according to the sixth embodiment of the present invention. The sectional view of the electrostatic breakdown protection device 124 and the latch-up protection device 126 in FIG. 10 is sectioned at the 11—11 line shown in FIG. 12. In FIG. 12, field oxide films 106, electrodes and so on are omitted and the hatching is used in spite of the plane pattern, and not sectional view, so as to understand the present invention more easily.

The semiconductor device according to the sixth embodiment has the same structure as the semiconductor device according to the second embodiment, except for the fourth diffusion region 164 in the protection device 126, which performs as a collector in a pnp-type parasitic bipolar Tr. The same parts in the sixth embodiment as those in the second embodiment are shown with the same reference characters and their explanations are omitted. An explanation of the operation of the sixth embodiment for the case of a surge voltage occurring is omitted because it is the same as that of the second embodiment.

In the semiconductor device according to the sixth embodiment, the fourth diffusion region 164 in the protection device 126, which is coupled with a supply voltage source Vcc through the highly doped diffusion region 166, also performs as the second p-type diffusion region 148 in the tolerance device 124 according to the second embodiment shown in FIG. 3. The first p-type diffusion region 146, the n-type substrate 120 and the fourth diffusion region 164 respectively correspond to an emitter, a base and a collector and form an pnp-type parasitic bipolar Tr 152a. A positive surge flowing from an input terminal corresponds to a forward bias for the parasitic bipolar Tr 152a. Consequently, the parasitic bipolar Tr 152a serves the same function as the tolerance device 124.

In the sixth embodiment, the fourth diffusion region 164 serves both as a part of the protection device 126 and as the second p-type diffusion region 148 of the tolerance device 124 in the second embodiment. Consequently, the area occupied by the protection device and the tolerance device can be reduced to an area smaller than that of the semiconductor device according to the second embodiment, while keeping the latch-up tolerance and the electrostatic break down tolerance.

Seventh Preferred Embodiment

Figure 13:
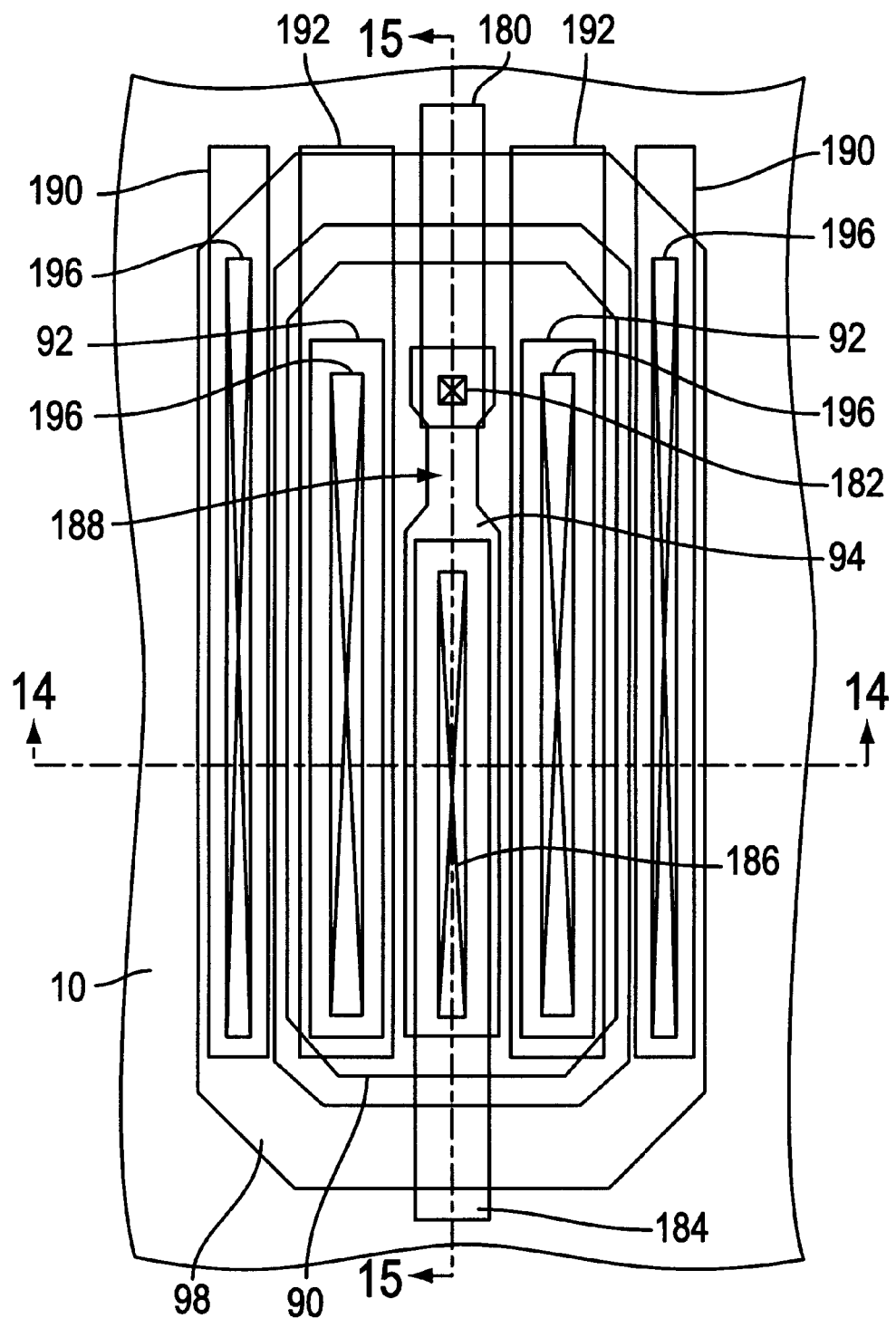
FIG. 13 shows a schematic pattern layout of a semiconductor device according to a seventh embodiment of the present invention.
Figure 14:
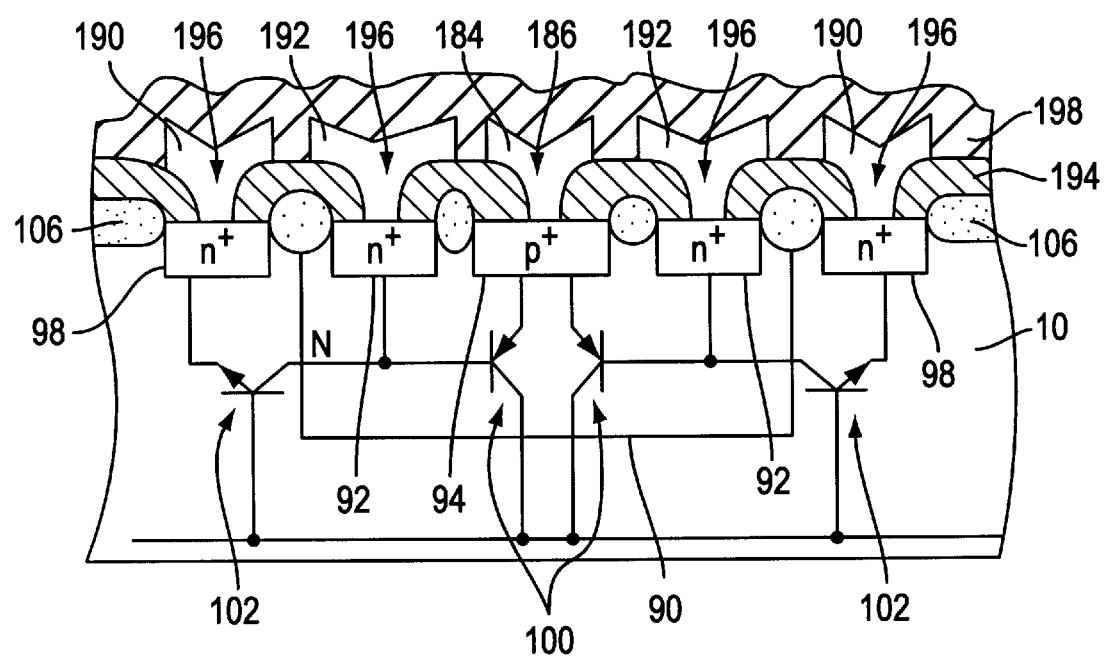
FIG. 14 is a sectional view showing the semiconductor device according to the seventh embodiment of the present invention, showing a vertical section along the direction 14—14 in FIG. 13.
Figure 15:
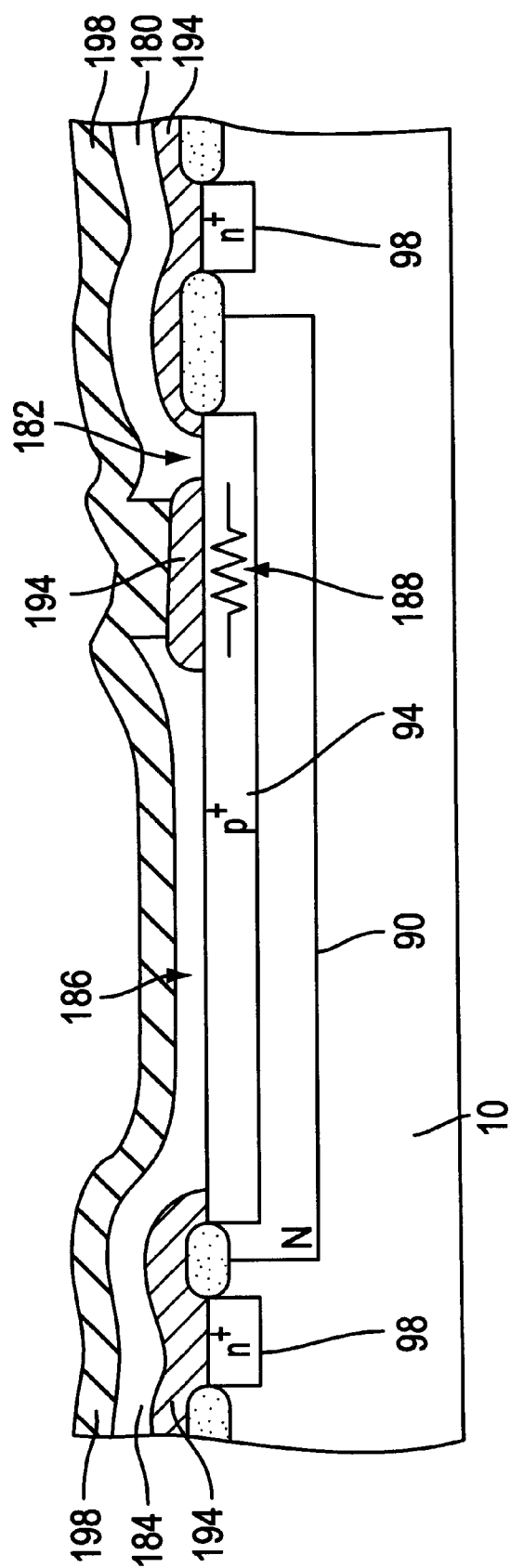
FIG. 15 is a sectional view showing the semiconductor device according to the seventh embodiment sectioned along the direction 15—15 in FIG. 13.

Referring to FIG. 13, FIGS. 14 and 15, a seventh preferred embodiment of the semiconductor devices according to the present invention is shown. FIG. 13 shows a schematic pattern layout of the semiconductor device according to the seventh embodiment of the present invention. In FIG. 13, field oxide films 106 and so on are omitted so as to understand the present invention more easily.

FIG. 14 is a cross-sectional view showing a typical semiconductor device including diffusion regions, electrodes and a parasitic circuit, according to a seventh embodiment of the present invention, sectioned at the 14—14 line shown in FIG. 13.

FIG. 15 is a cross-sectional view showing a typical semiconductor device including diffusion regions and electrodes according to a seventh embodiment of the present invention, sectioned at the 15—15 line shown in FIG. 13.

The semiconductor device according to the seventh embodiment has the same structure as the semiconductor device according to the first embodiment, except for a resistor for preventing an electrostatic break down which is formed with a part of the third diffusion region in the protection device 88 (See FIG. 1). The same parts in the seventh embodiment as in the first embodiment are shown with the same reference characters, and their explanations are omitted. An explanation of the operation of the seventh embodiment for the case of a surge voltage occurs is omitted because it is the same as that of the first embodiment.

In the semiconductor device according to the seventh embodiment, a control line 180 electrically coupled with a gate electrode in a CMOS internal circuit is electrically coupled with the third diffusion region 94 in the protection device 88. The control line (metallic line for coupling gates) 180 is coupled with the third diffusion region 94 through a first coupling hole 182. The third diffusion region 94 is electrically coupled with an input line 184 coupled with an input terminal through a second coupling hole 186.

A part of the third diffusion region 94 between the first coupling hole 182 and the second coupling hole 186 is used as the resistor for preventing an electrostatic break down (input protection resistor) 188 as shown in FIG. 15.

For the semiconductor device according to the seventh embodiment, the input protection resistor 188 has the simplest structure and acts as a resistor for preventing the electrostatic break down.

The input protection resistor 188 delays the application of a positive surge to the gate oxide film in the CMOS internal circuit. The delay time of the input protection resistor 188 can be adjusted by changing the size of the input protection resistor 188 so as not to affect a normal signal transmission of a semiconductor device.

In FIGS. 13, 14 and 15, metal lines 190 and 192 are for coupling with a ground voltage source Vss and a supply voltage source Vcc, respectively. The metal line 190 for coupling with the Vss is coupled with the fourth diffusion region 98 through a coupling hole 196 holed through an insulating layer 194. The metal line 192 for coupling with the Vcc is coupled with the second diffusion region 92 through a coupling hole 196 holed through an insulating layer 194. A surface protection layer 198 is formed on the surface.

The semiconductor device according to the seventh embodiment shown in FIG. 14 has a third parasitic Tr 100 and a fourth parasitic Tr 102.

The semiconductor device according to the seventh embodiment has a device for preventing the electrostatic break down in the protection device 88 so that the input protection resistor 188 prevents itself from being a new source of a latch-up trigger current.

In the seventh embodiment, both the third diffusion region 94 in the protection device 88
and the input protection resistor 188 as tolerance device are formed in a diffusion region so that the semiconductor device has an electrostatic break down tolerance without reducing a latch-up tolerance.

Eighth Preferred Embodiment

Figure 16:
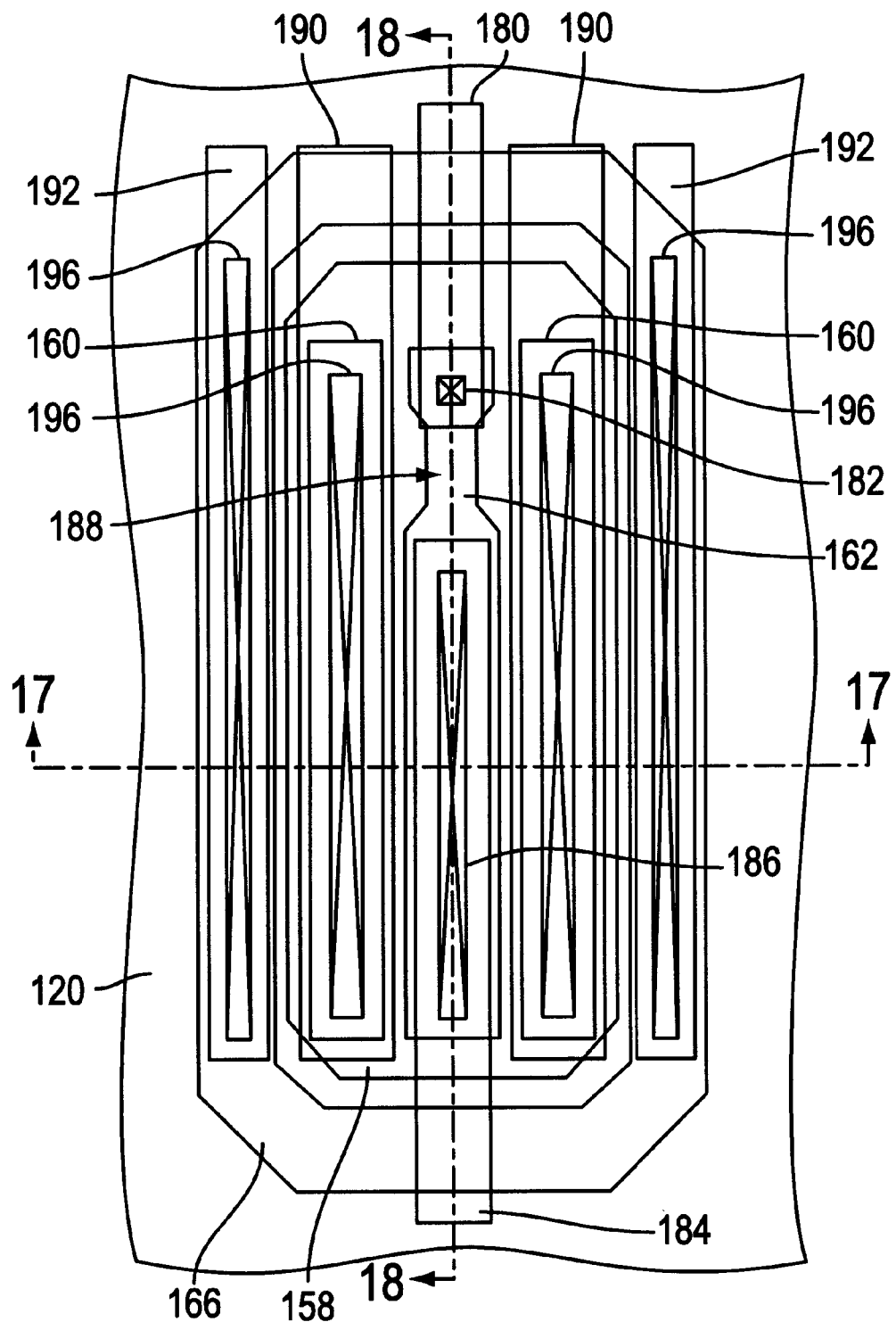
FIG. 16 shows a schematic pattern layout of a semiconductor device according to a eighth embodiment of the present invention.
Figure 17:
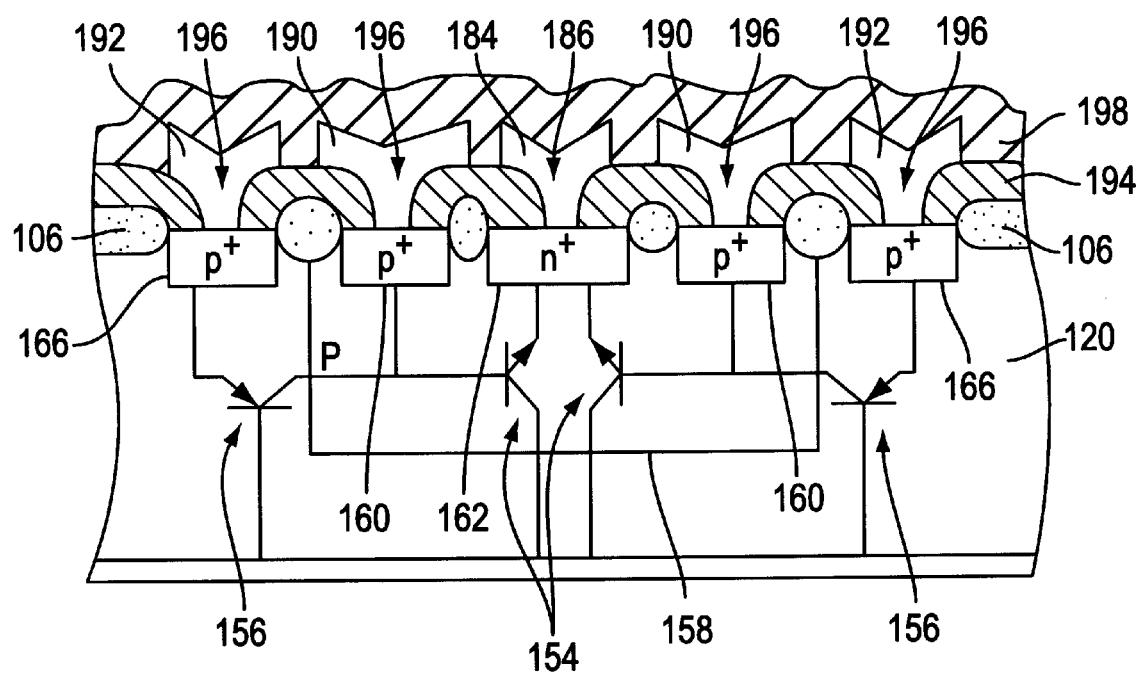
FIG. 17 is a sectional view showing the semiconductor device according to the eighth embodiment of the present invention, showing a vertical section along the direction 17—17 in FIG. 16.
Figure 18:
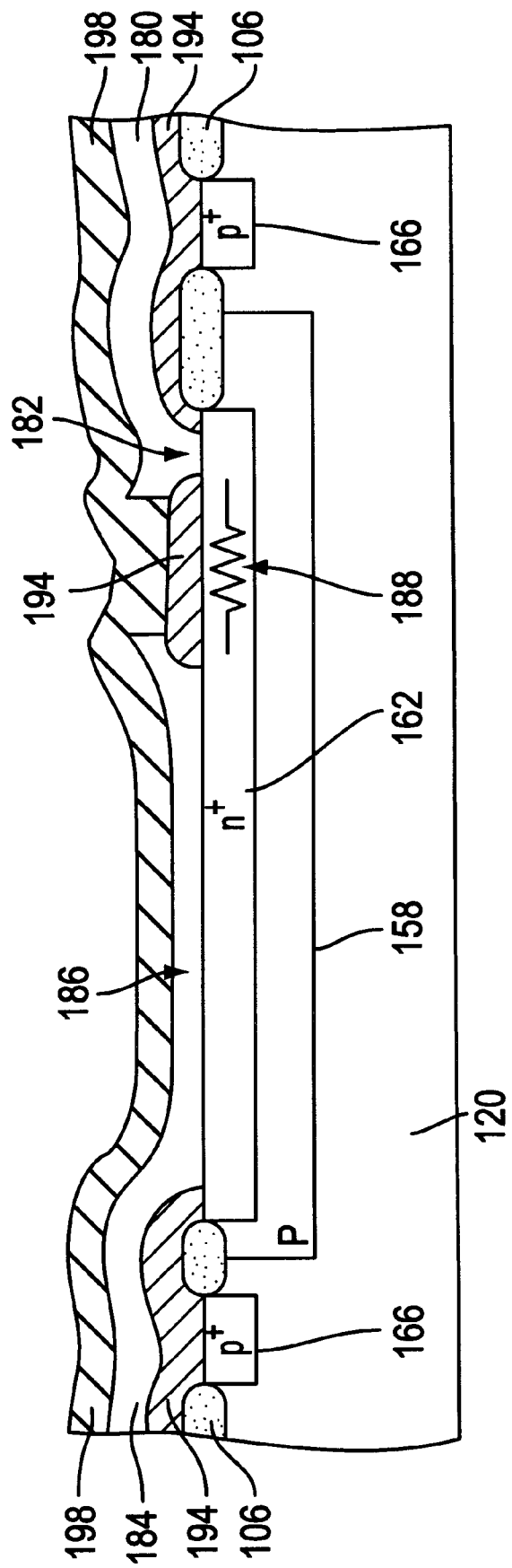
FIG. 18 is a sectional view showing the semiconductor device according to the eighth embodiment sectioned along the direction 18—18 in FIG. 16.

Referring to FIGS. 16, 17 and the FIG. 18, an eighth preferred embodiment of the semiconductor devices according to the present invention is shown. FIG. 16 shows a schematic pattern layout of the semiconductor device according to the eighth embodiment of the present invention. In FIG. 16, field oxide films 106 and so on are omitted so as to understand the present invention more easily.

FIG. 17 is a cross-sectional view showing a typical semiconductor device including diffusion regions, electrodes and a parasitic circuit, according to an eighth embodiment of the present invention, sectioned at the 17—17 line shown in FIG. 16.

FIG. 18 is a cross-sectional view showing a typical semiconductor device including diffusion regions and electrodes according to an eighth embodiment of the present invention, sectioned at the 18—18 line shown in FIG. 16.

The semiconductor device according to the eighth embodiment has the same structure as the semiconductor device according to the second embodiment, except for a resistor for preventing an electrostatic break down which is formed with a part of the third diffusion region 162 in the protection device 126 (See FIG. 3). The same parts in the eighth embodiment as in the second embodiment are shown with the same reference characters, and their explanations are omitted. An explanation of the operation of the eighth embodiment for the case of a surge voltage occurring is omitted because it is the same as that of the second embodiment.

In the semiconductor device according to the eighth embodiment, a control line 180 electrically coupled with a gate electrode in a CMOS internal circuit is electrically coupled with the third diffusion region 162 in the protection device 126. The control line (metallic line for coupling gates) 180 is coupled with the third diffusion region 162 through a first coupling hole 182. The third diffusion region 162 is electrically coupled with an input line 184 coupled with an input terminal through a second coupling hole 186.

A part of the third diffusion region 162 between the first coupling hole 182 and the second coupling hole 186 is used as the resistor for preventing an electrostatic break down (input protection resistor) 188 as shown in FIG. 18.

For the semiconductor device according to the eighth embodiment, the input protection resistor 188 has the simplest structure and acts as a resistor for preventing the electrostatic break down.

The input protection resistor 188 delays the application of a positive surge to the gate oxide film in the CMOS internal circuit. The delay time of the input protection resistor 188 is adjustable by changing the size of the input protection resistor 188 so as not to affect a normal signal transmission of a semiconductor device.

In the FIGS. 16, 17 and 18, metal lines 190 and 192 are for coupling with a ground voltage source Vss and a supply voltage source Vcc. The metal line 190 for coupling with the Vss is coupled with the second diffusion region 160 through a coupling hole 196 holed through an insulating layer 194. The metal line 192 for coupling with the Vcc is coupled with the fourth diffusion region 166 through a coupling hole 196 holed through an insulating layer 194. A surface protection layer 198 is formed on the surface.

The semiconductor device according to the eighth embodiment shown in FIG. 17 has a third parasitic Tr 154 and a fourth parasitic Tr 156.

The semiconductor device according to the eighth embodiment has a device for preventing the electrostatic break down in the protection device 126 so that the input protection resistor 188 prevents itself from being a new source of a latch-up trigger current.

In the eighth embodiment, both the third diffusion region 162 in the protection device 126
and the input protection resistor 188 as a tolerance device are formed in a diffusion region so that the semiconductor device has an electrostatic break down tolerance without reducing a latch-up tolerance.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention. For example, the fourth diffusion region, which is formed by surrounding the whole first diffusion region on the surface of the substrate, does not need to be formed by surrounding the whole diffusion region but may be formed by a plane pattern having a "U" shape.

In summary, it will be seen that the present invention provides a semiconductor device which allows surge to flow from an input line to a first or second supply voltage source line through the SCR, which is the parasitic bipolar Tr in the protection device. Consequently, the semiconductor device reduces the surge flowing into a CMOS internal circuit and has a latch-up tolerance and an electrostatic break down tolerance without delaying operation speed. Moreover, the area occupied by the protection device can be reduced because the distance between the second and third diffusion regions, which is separated by a gate electrode, can be shorter than the distance separated by a field oxide film.

We claim:

1. A semiconductor device including a substrate bias generating circuit for generating a substrate bias for a semiconductor substrate of a first conductive type, a CMOS circuit formed on the semiconductor substrate, and a first protection circuit formed on the semiconductor substrate for preventing a latch-up from occurring in the CMOS circuit, the first protection circuit comprising:

a first diffusion region of a second conductive type having a first perimeter and formed on the substrate;

a second diffusion region of the second conductive type doped more than said first diffusion region, said second diffusion region being formed in said first diffusion region and electrically coupled with a first power supply having a first potential;

a third diffusion region of the first conductive type formed apart from said second diffusion region in said first diffusion region, and electrically coupled with an input line; and a fourth diffusion region of the second conductive type formed on the substrate, said fourth diffusion region having a fourth perimeter spaced apart from the first perimeter of said first diffusion region and electrically coupled with a second power supply having a second potential different from the first potential of the first power supply;

wherein the substrate is electrically coupled with the substrate bias generating circuit outside of the fist protection circuit.

2. The semiconductor device according to claim 1, wherein the first protection circuit further comprises a control gate electrode formed on said first diffusion region between said second diffusion region and said third diffusion region.

3. The semiconductor device according to claim 1, further comprising a second protection circuit comprising a bipolar transistor having an emitter, and wherein said fourth diffusion region operates as the emitter of said bipolar transistor.

4. The semiconductor device according to claim 1, further comprising a second protection circuit for preventing electrostatic breakdown from occurring in the CMOS circuit, said second protection circuit comprising a protection resistor formed from said third diffusion region.

5. The semiconductor device according to claim 4, wherein the protection resistor comprises a first electrode formed on said third diffusion region and electrically coupled with a control gate electrode of the CMOS circuit, and a second electrode formed on said third diffusion region and electrically coupled with the input line; and wherein a part of said third diffusion region between the first electrode and the second electrode forms the protection resister of said second protection circuit.

6. A semiconductor device including a semiconductor substrate of a first conductive type, a substrate bias generating circuit for generating a substrate bias for the semiconductor substrate, a CMOS circuit formed on the semiconductor substrate, a semiconductor controlled rectifier device for preventing a latch-up from occurring in the CMOS circuit, and a second protection circuit for preventing electrostatic breakdown from occurring in the CMOS circuit, the semiconductor controlled rectifier device comprising:

a first diffusion region of a second conductive type having a first perimeter, said first diffusion region being formed on the substrate and electrically coupled with a first power supply having a first potential;

a second diffusion region of the first conductive type formed in said first diffusion region and electrically coupled with an input line;

a third diffusion region of the second conductive type formed in the substrate, said third diffusion region having a third perimeter spaced apart from the first perimeter of said first diffusion region and electrically coupled with a second power supply having a second potential different from the first potential of the first power supply; and an electrode formed on the substrate, except on said first, second, and third diffusion regions, and electrically coupling the substrate with the substrate bias generating circuit.

7. The semiconductor device according to claim 6, wherein the semiconductor controlled rectifier device further comprises a bipolar transistor having an emitter, and wherein said third diffusion region operates as the emitter of said bipolar transistor.

8. The semiconductor device according to claim 6, wherein the semiconductor controlled rectifier device further comprises a resistor formed from said second diffusion region.

9. The semiconductor device according to claim 8 wherein the resistor comprises a first electrode formed on said second diffusion region and electrically coupled with a control gate electrode of the CMOS circuit, and a second electrode formed on said second diffusion region between the first electrode and the second electrode forms the resistor.

10. The semiconductor device according to claim 1, wherein the fourth diffusion region surrounds the first diffusion region.

11. The semiconductor device according to claim 1, wherein the fourth diffusion region partially surrounds the first diffusion region.

12. The semiconductor device according to claim 6, wherein the third diffusion region surrounds the first diffusion region.

13. The semiconductor device according to claim 6, wherein the third diffusion region partially surrounds the first diffusion region.

* * * * *